United States Patent
Lopez-Julia et al.

(10) Patent No.: US 12,543,410 B2
(45) Date of Patent: Feb. 3, 2026

(54) LIGHT-COLLECTING STRUCTURES FOR A LIGHT-EMITTING ARRAY

(71) Applicant: LUMILEDS LLC, San Jose, CA (US)

(72) Inventors: Antonio Lopez-Julia, Aachen (DE); Aimi Abass, Aachen (DE)

(73) Assignee: Lumileds Singapore Pte. Ltd., Singapore (SG)

( * ) Notice: Subject to any disclaimer, the term of this patent is extended or adjusted under 35 U.S.C. 154(b) by 457 days.

(21) Appl. No.: 17/991,317

(22) Filed: Nov. 21, 2022

(65) Prior Publication Data

US 2023/0187577 A1 Jun. 15, 2023

Related U.S. Application Data

(60) Provisional application No. 63/289,607, filed on Dec. 14, 2021.

(51) Int. Cl.
| | |
|---|---|
| *H10H 20/819* | (2025.01) |
| *H10H 20/01* | (2025.01) |
| *H10H 20/825* | (2025.01) |
| *H10H 20/841* | (2025.01) |

(Continued)

(52) U.S. Cl.
CPC ...... *H10H 20/819* (2025.01); *H10H 20/0137* (2025.01); *H10H 20/841* (2025.01); *H01L 25/167* (2013.01); *H10H 20/825* (2025.01); *H10H 29/142* (2025.01)

(58) Field of Classification Search
CPC .......................... H10H 20/819; H10H 20/8314
See application file for complete search history.

(56) References Cited

U.S. PATENT DOCUMENTS

| | | |
|---|---|---|
| 11,587,972 B2 | 2/2023 | Jang et al. |
| 2016/0118448 A1 | 4/2016 | Epstein et al. |
| 2016/0190396 A1 | 6/2016 | Lee et al. |

(Continued)

FOREIGN PATENT DOCUMENTS

| | | |
|---|---|---|
| CN | 112582509 A | 3/2021 |
| KR | 10-2020-0021391 A | 2/2020 |

OTHER PUBLICATIONS

From KIPO as the ISA, Notification of Transmittal of the International Search Report and the Written Opinion of the International Searching Authority, or the Declaration, PCT/US2022/050716, Apr. 3, 2023, 12 pages.

(Continued)

*Primary Examiner* — Moazzam Hossain

(57) ABSTRACT

A semiconductor LED includes p-doped, n-doped, and active layers, and has anode and cathode electrical contacts, a lateral dielectric layer on the side surfaces of the LED, and an electrically conductive bonding layer on the lateral dielectric layer. The bonding layer is electrically coupled to the anode electrical contact and electrically insulated from side surfaces of the active and n-doped layers by the lateral dielectric layer. The LED has a cross-sectional area that increases monotonically with increasing distance from its anode contact surface toward its light-exit surface. Side-surface shape is arranged so that internal reflection within the LED or lateral dielectric layer redirects a portion of light, emitted by the active layer and propagating within the LED outside an escape cone, to propagate toward the exit surface of the n-doped layer within the escape cone.

19 Claims, 16 Drawing Sheets

(51) Int. Cl.
   *H01L 25/16*     (2023.01)
   *H10H 29/14*     (2025.01)

(56) References Cited

U.S. PATENT DOCUMENTS

2017/0330517 A1    11/2017   Gu et al.
   2020/0251049 A1     8/2020   Morris et al.
   2020/0403107 A1    12/2020   Chu
   2021/0020619 A1     1/2021   Iguchi et al.
   2021/0265526 A1     8/2021   Thompson
   2021/0288222 A1     9/2021   Young et al.
   2021/0296533 A1     9/2021   Tang et al.
   2021/0383683 A1    12/2021   Camras et al.
   2025/0040326 A1*    1/2025   von Malm ........... H10H 20/841
   2025/0040328 A1*    1/2025   Varghese ............. H10H 20/857

OTHER PUBLICATIONS

The extended European search report, EP22908207.8, Jul. 11, 2025, 11 pages.

* cited by examiner

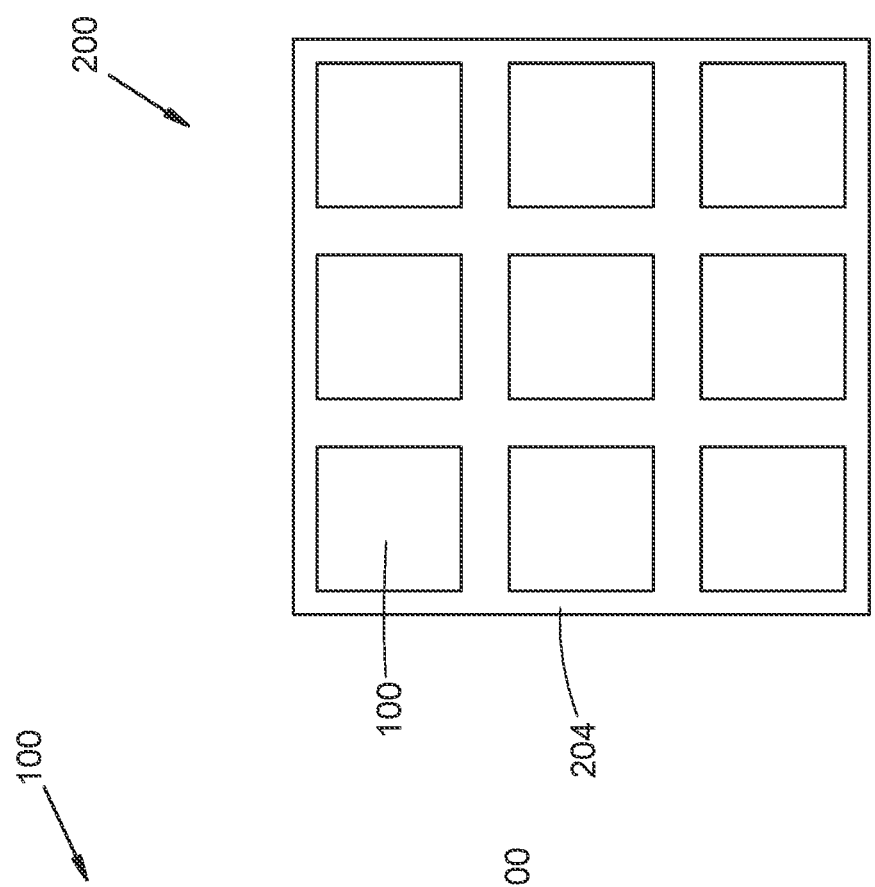
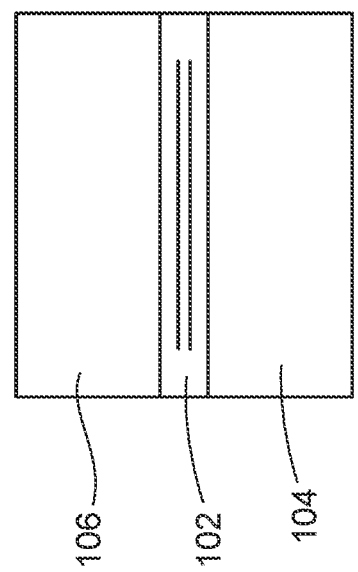
FIG. 1
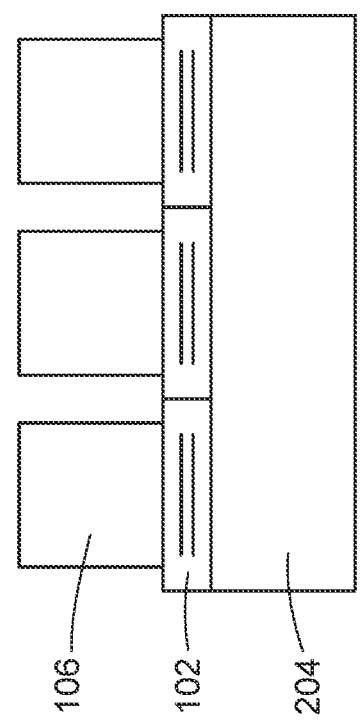
FIG. 2A
FIG. 2B

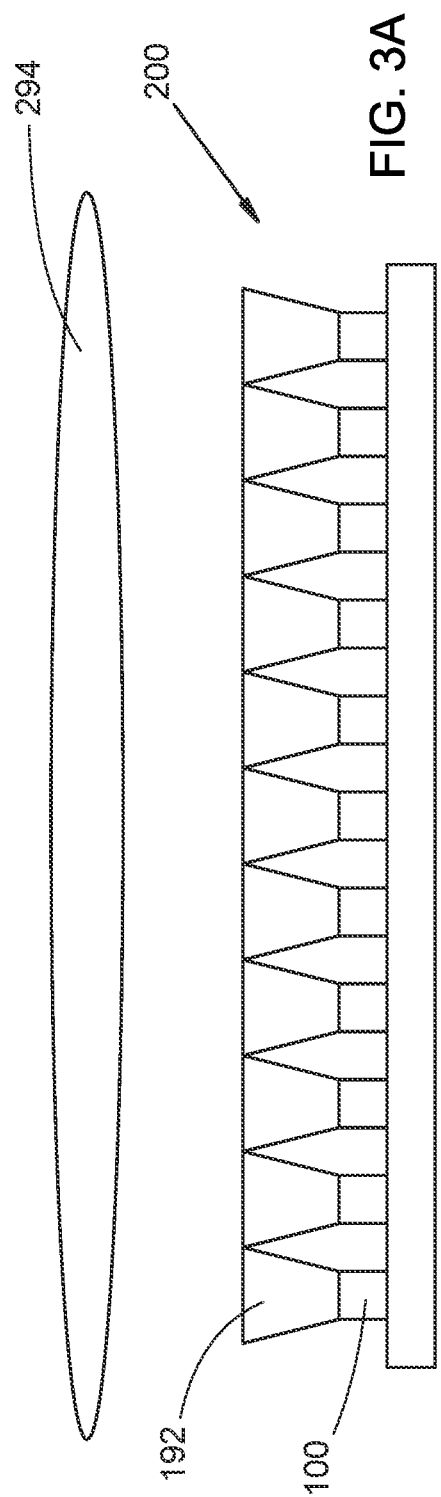
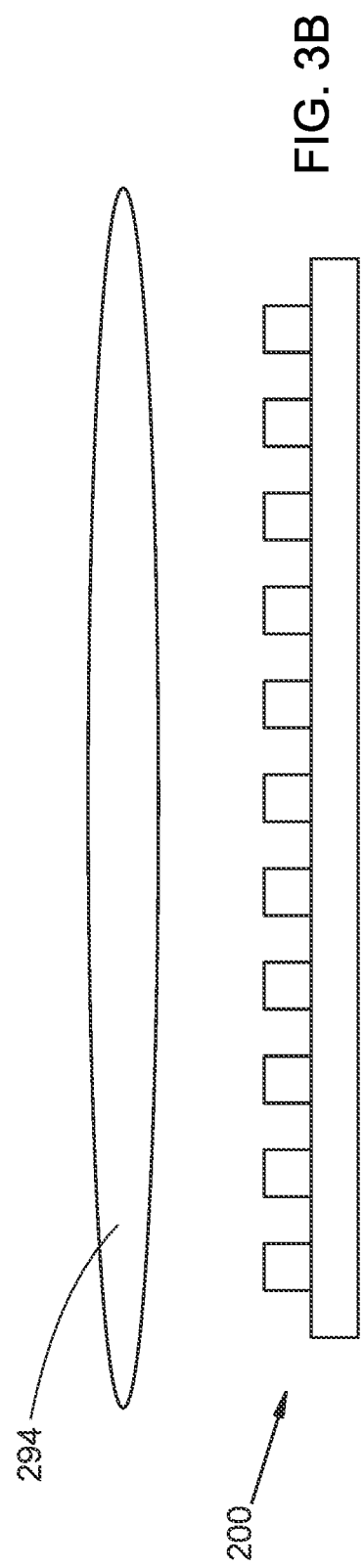

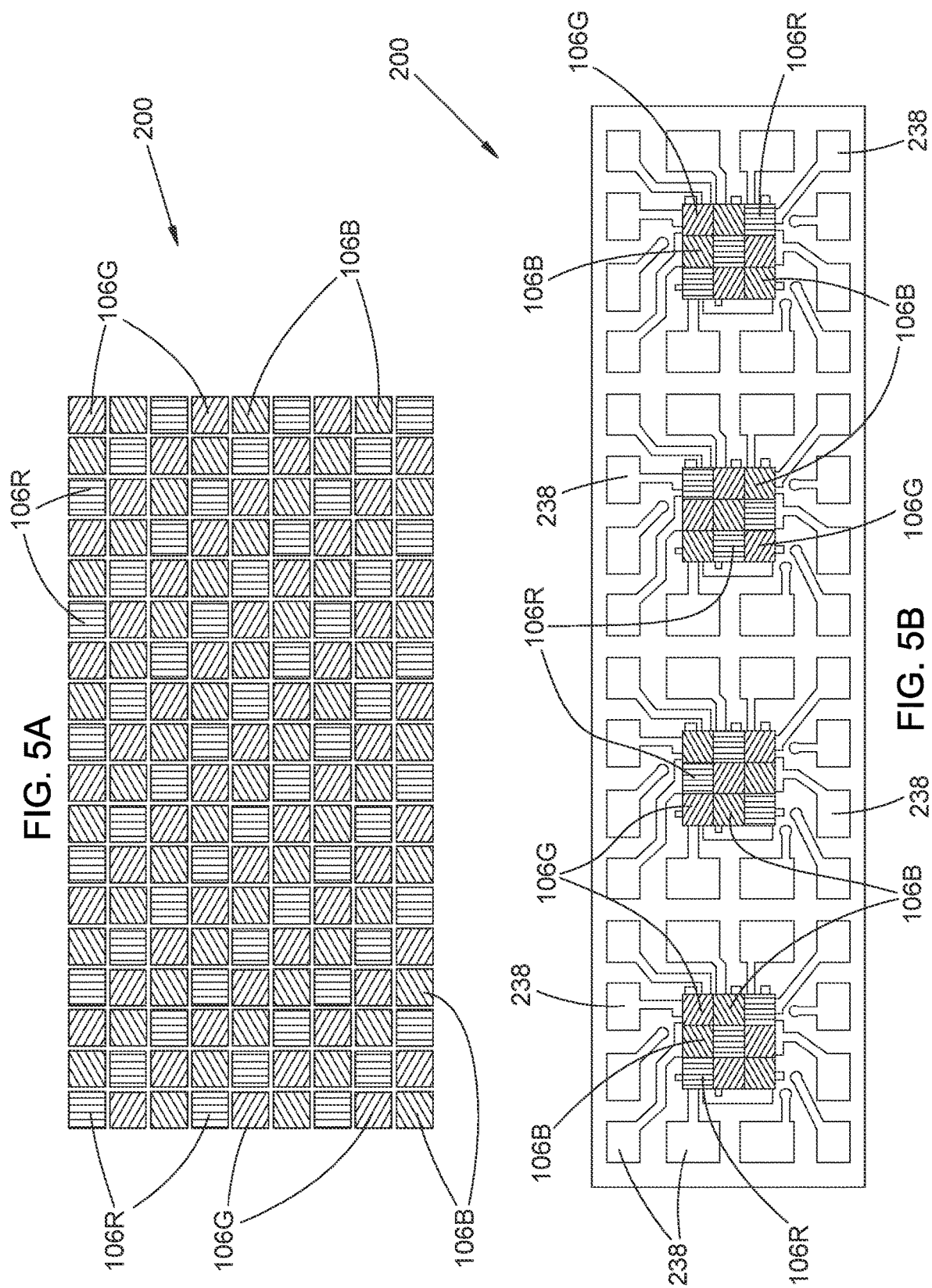

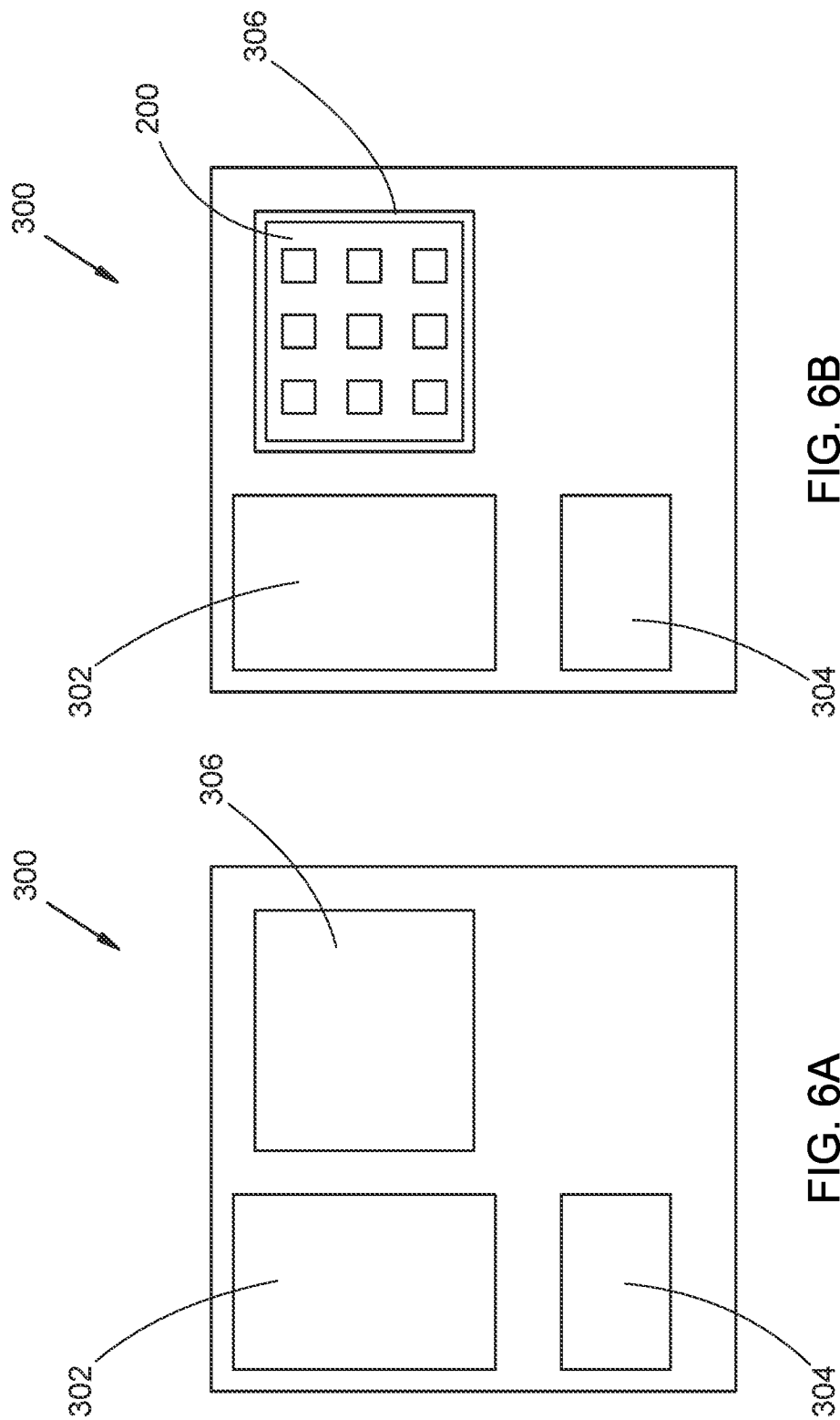

LIGHT-COLLECTING STRUCTURES FOR A LIGHT-EMITTING ARRAY

BENEFIT CLAIM

This application claims benefit of U.S. provisional App. No. 63/289,607 entitled "Light-collecting structures for a light-emitting array" filed 14 Dec. 2021 in the names of Lopez-Julia et al; said application is incorporated herein by reference in its entirety.

FIELD OF THE INVENTION

The invention relates generally to light emitting diodes and to phosphor-converted light emitting diodes.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED. Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

Multiple LEDs or pcLEDs can be formed together on a single substrate to form an array. Such arrays can be employed to form active illuminated displays, such as those employed in, e.g., smartphones and smart watches, computer or video displays, augmented- or virtual-reality displays, or signage, or to form adaptive illumination sources, such as those employed in, e.g., automotive headlights, street lighting, camera flash sources, or flashlights (i.e., torches). An array having one or several or many individual devices per millimeter (e.g., device pitch or spacing of about a millimeter, a few hundred microns, or less than 100 microns, and separation between adjacent devices less than 100 microns or only a few tens of microns or less) typically is referred to as a miniLED array or a microLED array (alternatively, a μLED array). Such mini- or microLED arrays can in many instances also include phosphor converters as described above; such arrays can be referred to as pc-miniLED or pc-microLED arrays.

SUMMARY

An light-emitting element comprises a semiconductor light-emitting diode (LED), anode and cathode electrical contacts, a lateral dielectric layer, and an electrically conductive bonding layer. The LED includes a p-doped semiconductor layer, an n-doped semiconductor layer, and an active, light-emitting layer between the p-doped and n-doped layers. The LED has (i) a light-exit surface of the n-doped layer opposite the active layer, (ii) an anode contact surface of the p-doped layer opposite the active layer, and (iii) one or more side surfaces that laterally confine the p-doped layer, the active layer, and at least a portion of the n-doped layer. The anode electrical contact is positioned on the anode contact surface and electrically coupled to the p-doped layer. The cathode electrical contact is electrically coupled to the n-doped layer. The lateral dielectric layer is positioned on the one or more side surfaces of the LED, and the bonding layer is positioned on the lateral dielectric layer. The bonding layer is electrically coupled to the anode electrical contact and electrically insulated from side surfaces of the active and n-doped layers by the lateral dielectric layer. The LED has a side-surface shape characterized by a cross-sectional area that increases monotonically with increasing distance from the anode contact surface of the p-doped layer toward the light-exit surface of the n-doped layer. That side-surface shape is arranged so that internal reflection within the LED or lateral dielectric layer redirects a portion of light, emitted by the active layer and propagating within the LED outside an escape cone, to propagate toward the exit surface of the n-doped layer within the escape cone.

Objects and advantages pertaining to LEDs, pcLEDs, miniLED arrays, pc-miniLED arrays, microLED arrays, and pc-microLED arrays may become apparent upon referring to the examples illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIG. 1 shows a schematic cross-sectional view of an example pcLED.

FIGS. 2A and 2B show, respectively, cross-sectional and top schematic views of an example array of pcLEDs.

FIG. 3A shows a schematic cross-sectional view of an example array of pcLEDs arranged with respect to waveguides and a projection lens. FIG. 3B shows an arrangement similar to that of FIG. 3A, but without the waveguides.

FIG. 5A is a schematic top view of a portion of an example LED display in which each display pixel is a red, green, or blue phosphor-converted LED pixel. FIG. 5B is a schematic top view of a portion of an example LED display in which each display pixel includes multiple phosphor-converted LED pixels (red, green, and blue) integrated onto a single die that is bonded to a control circuit backplane.

FIG. 6A shows a schematic top view an example electronics board on which an array of pcLEDs may be mounted, and FIG. 6B similarly shows an example array of pcLEDs mounted on the electronic board of FIG. 6A.

Figure 4A:
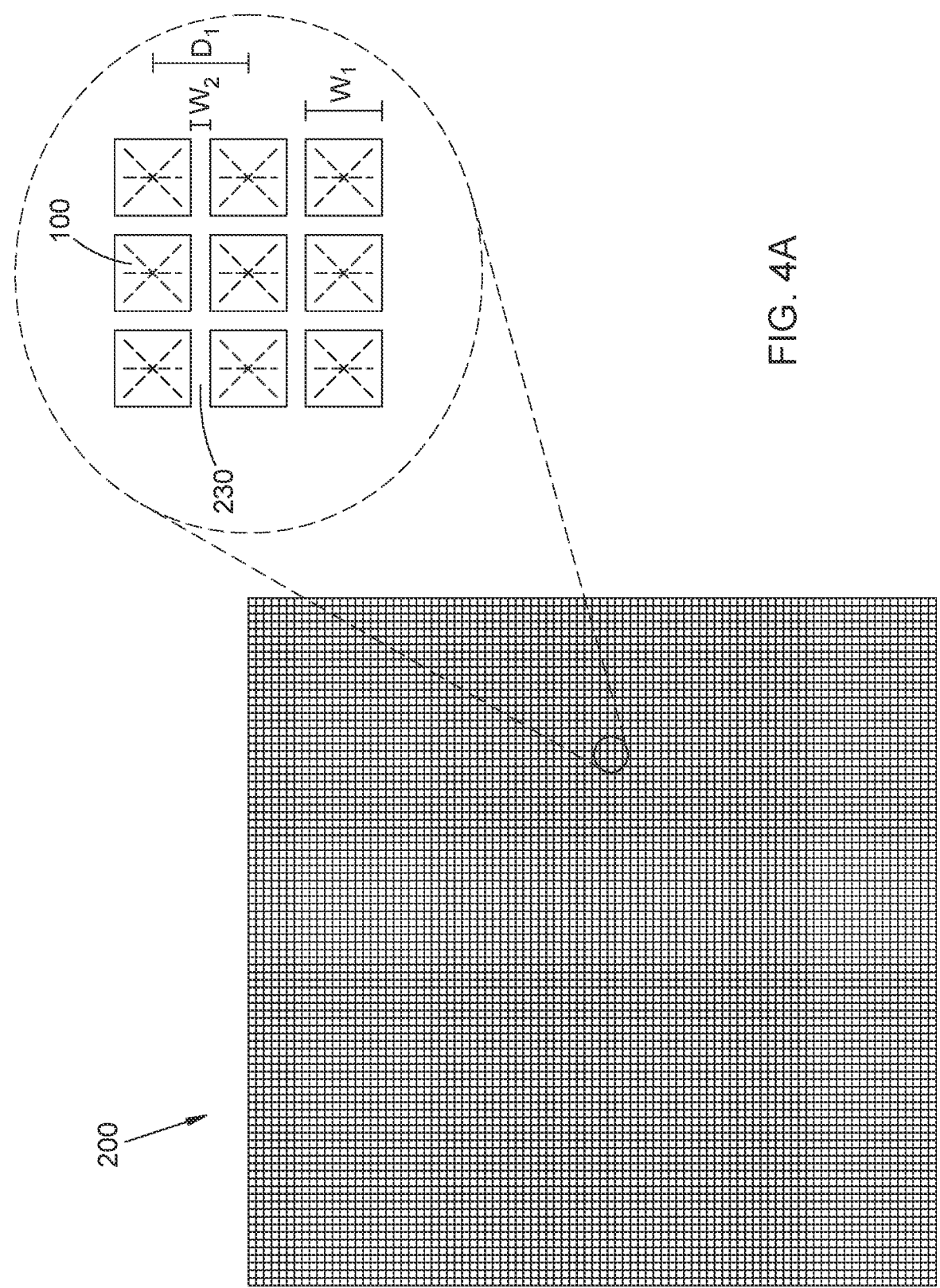
FIG. 4A shows a top schematic view of an example miniLED or microLED array and an enlarged section of 3×3 LEDs of the array.

The examples depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. For example, individual LEDs may be exaggerated in their vertical dimensions or layer thicknesses relative to their lateral extent or relative to substrate or phosphor thicknesses. The examples shown should not be construed as limiting the scope of the present disclosure or appended claims.

DETAILED DESCRIPTION

The following detailed description should be read with reference to the drawings, in which identical reference numbers refer to like elements throughout the different figures. The drawings, which are not necessarily to scale, depict selective examples and are not intended to limit the scope of the inventive subject matter. The detailed description illustrates by way of example, not by way of limitation, the principles of the inventive subject matter. For purposes of simplicity and clarity, detailed descriptions of well-known devices, circuits, and methods may be omitted so as not to obscure the description of the inventive subject matter with unnecessary detail.

FIG. 1 shows an example of an individual pcLED 100 comprising a semiconductor diode structure 102 disposed on a substrate 104, together considered herein an "LED" or "semiconductor LED", and a wavelength converting structure (e.g., phosphor layer) 106 disposed on the semiconductor LED. Semiconductor diode structure 102 typically comprises an active region disposed between n-type and p-type layers. Application of a suitable forward bias across the diode structure 102 results in emission of light from the active region. The wavelength of the emitted light is determined by the composition and structure of the active region.

The LED may be, for example, a III-Nitride LED that emits blue, violet, or ultraviolet light. LEDs formed from any other suitable material system and that emit any other suitable wavelength of light may also be used. Other suitable material systems may include, for example, III-Phosphide materials, III-Arsenide materials, other binary, ternary, or quaternary alloys of gallium, aluminum, indium, nitrogen, phosphorus, or arsenic, or II-VI materials.

Any suitable phosphor materials may be used for or incorporated into the wavelength converting structure 106, depending on the desired optical output from the pcLED.

FIGS. 2A-2B show, respectively, cross-sectional and top views of an array 200 of pcLEDs 100, each including a phosphor pixel 106, disposed on a substrate 204. Such an array can include any suitable number of pcLEDs arranged in any suitable manner. In the illustrated example the array is depicted as formed monolithically on a shared substrate, but alternatively an array of pcLEDs can be formed from separate individual pcLEDs (e.g., singulated devices that are assembled onto an array substrate). Individual phosphor pixels 106 are shown in the illustrated example, but alternatively a contiguous layer of phosphor material can be disposed across multiple LEDs 102. In some instances the array 200 can include light barriers (e.g., reflective, scattering, and/or absorbing) between adjacent LEDs 102, phosphor pixels 106, or both. Substrate 204 may optionally include electrical traces or interconnects, or CMOS or other circuitry for driving the LED, and may be formed from any suitable materials.

Individual pcLEDs 100 may optionally incorporate or be arranged in combination with a lens or other optical element located adjacent to or disposed on the phosphor layer. Such an optical element, not shown in the figures, may be referred to as a "primary optical element". In addition, as shown in FIGS. 3A and 3B, a pcLED array 200 (for example, mounted on an electronics board) may be arranged in combination with secondary optical elements such as waveguides, lenses, or both for use in an intended application. In FIG. 3A, light emitted by each pcLED 100 of the array 200 is collected by a corresponding waveguide 192 and directed to a projection lens 294. Projection lens 294 may be a Fresnel lens, for example. This arrangement may be suitable for use, for example, in automobile headlights or other adaptive illumination sources. Other primary or secondary optical elements of any suitable type or arrangement can be included for each pixel, as needed or desired. In FIG. 3B, light emitted by pcLEDs of the array 200 is collected directly by projection lens 294 without use of intervening waveguides. This arrangement may particularly be suitable when pcLEDs can be spaced sufficiently close to each other, and may also be used in automobile headlights as well as in camera flash applications or other illumination sources. A miniLED or microLED display application may use similar optical arrangements to those depicted in FIGS. 3A and 3B, for example. Generally, any suitable arrangement of optical elements (primary, secondary, or both) can be used in combination with the pcLEDs described herein, depending on the desired application.

Although FIGS. 2A and 2B show a 3×3 array of nine pcLEDs, such arrays may include for example on the order of $10^1$, $10^2$, $10^3$, $10^4$, or more LEDs, e.g., as illustrated schematically in FIG. 4A. Individual LEDs 100 (i.e., pixels) may have widths $w_1$ (e.g., side lengths) in the plane of the array 200, for example, less than or equal to 1 millimeter (mm), less than or equal to 500 microns, less than or equal to 100 microns, or less than or equal to 50 microns. LEDs 100 in the array 200 may be spaced apart from each other by streets, lanes, or trenches 230 having a width $w_2$ in the plane of the array 200 of, for example, hundreds of microns, less than or equal to 100 microns, less than or equal to 50 microns, less than or equal to 20 microns, less than or equal to 10 microns, or less than or equal to 5 microns. The pixel pitch or spacing $D_1$ is the sum of $w_1$ and $w_2$. Although the illustrated examples show rectangular pixels arranged in a symmetric matrix, the pixels and the array may have any suitable shape or arrangement, whether symmetric or asymmetric. Multiple separate arrays of LEDs can be combined in any suitable arrangement in any applicable format to form a larger combined array or display.

LEDs having dimensions $w_1$ in the plane of the array (e.g., side lengths) of less than or equal to about 0.10 millimeters microns are typically referred to as microLEDs, and an array of such microLEDs may be referred to as a microLED array. LEDs having dimensions $w_1$ in the plane of the array (e.g., side lengths) of between about 0.10 millimeters and about 1.0 millimeters are typically referred to as miniLEDs, and an array of such miniLEDs may be referred to as a miniLED array.

Figure 4B:
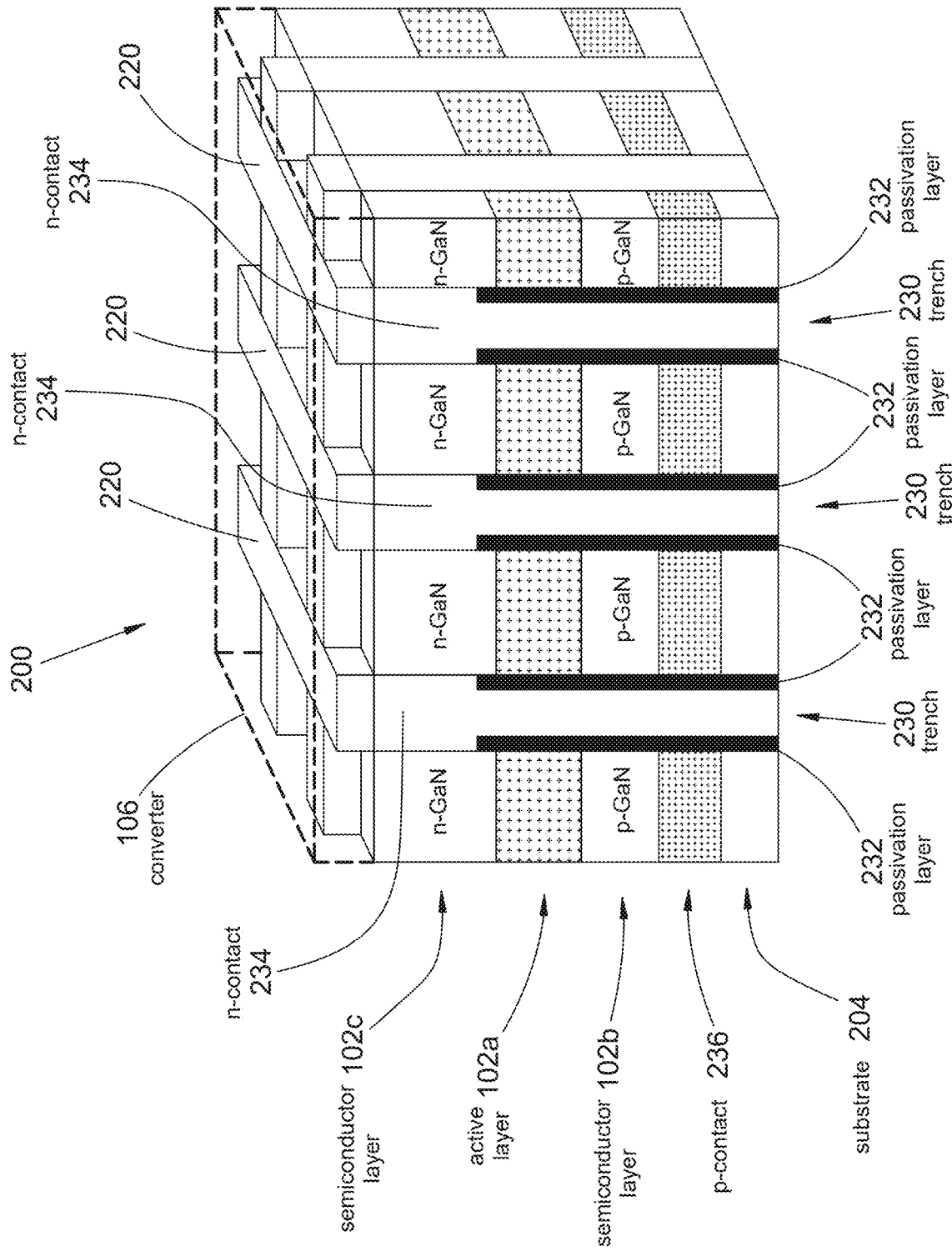
FIG. 4B shows a perspective view of several LEDs of an example pc-miniLED or pc-microLED array monolithically formed on a substrate.

An array of LEDs, miniLEDs, or microLEDs, or portions of such an array, may be formed as a segmented monolithic structure in which individual LED pixels are electrically isolated from each other by trenches and or insulating material. FIG. 4B shows a perspective view of an example of such a segmented monolithic LED array 200. Pixels in this array (i.e., individual semiconductor LED devices 102) are separated by trenches 230 which are filled to form n-contacts 234. The monolithic structure is grown or disposed on the substrate 204. Each pixel includes a p-contact 236, a p-GaN semiconductor layer 102b, an active region 102a, and an n-GaN semiconductor layer 102c; the layers 102a/102b/102c collectively form the semiconductor LED 102. A wavelength converter material 106 may be deposited on the semiconductor layer 102c (or other applicable intervening layer). Passivation layers 232 may be formed within the trenches 230 to separate at least a portion of the n-contacts 234 from one or more layers of the semiconductor. The n-contacts 234, other material within the trenches 230, or material different from material within the trenches 230 may extend into the converter material 106 to form complete or partial optical isolation barriers 220 between the pixels.

Figure 4C:
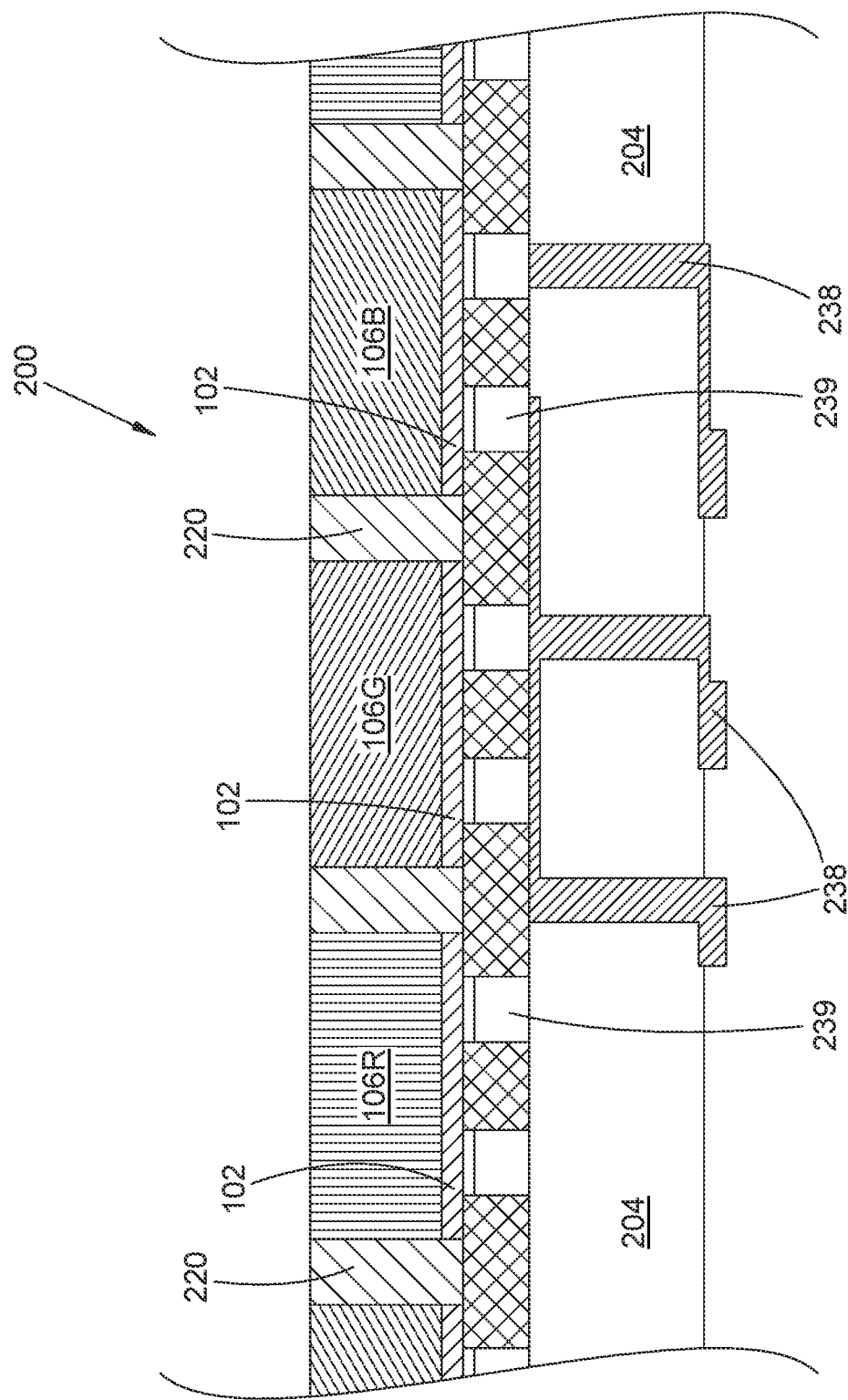
FIG. 4C is a side cross-sectional schematic diagram of an example of a close-packed array of multi-colored phosphor-converted LEDS on a monolithic die and substrate.
Figure 7:
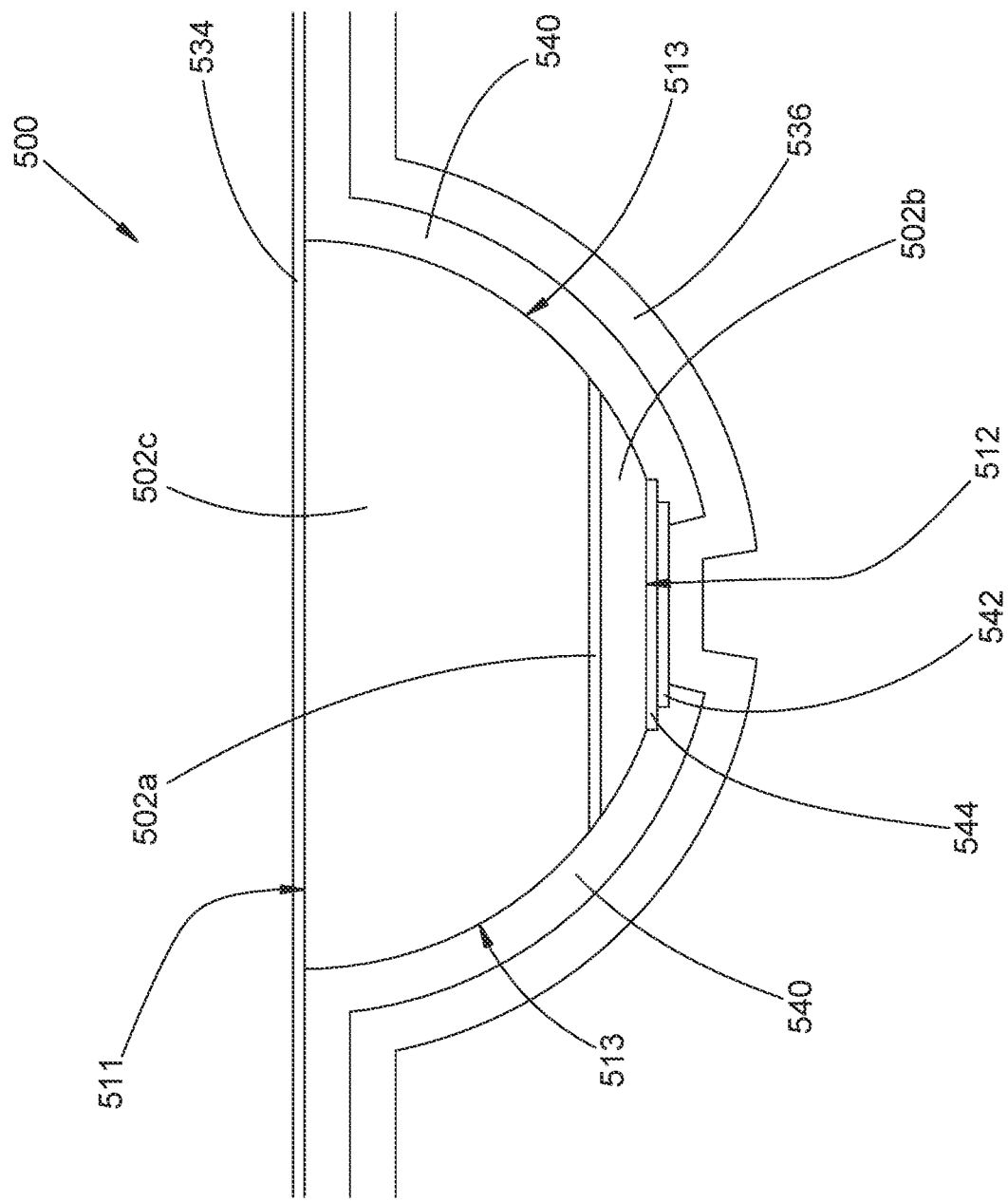
FIG. 7 is a schematic longitudinal cross-sectional view of an example light-emitting element.

FIG. 4C is a schematic cross-sectional view of a close packed array 200 of multi-colored, phosphor converted LEDs 100 on a monolithic die and substrate 204. The side view shows GaN LEDs 102 attached to the substrate 204 through metal interconnects 239 (e.g., gold-gold interconnects or solder attached to copper micropillars) and metal interconnects 238. Phosphor pixels 106 are positioned on or over corresponding GaN LED pixels 102. The semiconductor LED pixels 102 or phosphor pixels 106 (often both) can be coated on their sides with a reflective mirror or diffusive scattering layer to form an optical isolation barrier 220. In this example each phosphor pixel 106 is one of three different colors, e.g., red phosphor pixels 106R, green phosphor pixels 106G, and blue phosphor pixels 106B (still referred to generally or collectively as phosphor pixels 106). Such an arrangement can enable use of the LED array 200 as a color display.

The individual LEDs (pixels) in an LED array may be individually addressable, may be addressable as part of a group or subset of the pixels in the array, or may not be addressable. Thus, light emitting pixel arrays are useful for any application requiring or benefiting from fine-grained intensity, spatial, and temporal control of light distribution. These applications may include, but are not limited to, precise special patterning of emitted light from pixel blocks or individual pixels, in some instances including the formation of images as a display device. Depending on the application, emitted light may be spectrally distinct, adaptive over time, and/or environmentally responsive. The light emitting pixel arrays may provide preprogrammed light distribution in various intensity, spatial, or temporal patterns. The emitted light may be based at least in part on received sensor data and may be used for optical wireless communications. Associated electronics and optics may be distinct at a pixel, pixel block, or device level.

FIGS. 5A and 5B are examples of LED arrays 200 employed in display applications, wherein an LED display includes a multitude of display pixels. In some examples (e.g., as in FIG. 5A), each display pixel comprises a single semiconductor LED pixel 102 and a corresponding phosphor pixel 106R, 106G, or 106B of a single color (red, green, or blue). Each display pixel only provides one of the three colors. In some examples (e.g., as in FIG. 5B), each display pixel includes multiple semiconductor LED pixels 102 and multiple corresponding phosphor pixels 106 of multiple colors. In the example shown each display pixel includes a 3×3 array of semiconductor pixels 102; three of those LED pixels have red phosphor pixels 106R, three have green phosphor pixels 106G, and three have blue phosphor pixels 106B. Each display pixel can therefore produce any desired color combination. In the example shown the spatial arrangement of the different colored phosphor pixels 106 differs among the display pixels; in some examples (not shown) each display pixel can have the same arrangement of the different colored phosphor pixels 106.

As shown in FIGS. 6A and 6B, a pcLED array 200 may be mounted on an electronics board 300 comprising a power and control module 302, a sensor module 304, and an LED attach region 306. Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, pcLED array 200 may be mounted on a separate board (not shown) from the power and control module and the sensor module.

An array of independently operable LEDs or pcLEDs may be used in combination with a lens, lens system, or other optic or optical system (e.g., as described above) to provide illumination that is adaptable for a particular purpose. For example, in operation such an adaptive lighting system may provide illumination that varies by color and/or intensity across an illuminated scene or object and/or is aimed in a desired direction. Beam focus or steering of light emitted by the LED or pcLED array can be performed electronically by activating LEDs or pcLEDs in groups of varying size or in sequence, to permit dynamic adjustment of the beam shape and/or direction without moving optics or changing the focus of the lens in the lighting apparatus. A controller can be configured to receive data indicating locations and color characteristics of objects or persons in a scene and based on that information control LEDs or pcLEDs in an array to provide illumination adapted to the scene. Such data can be provided for example by an image sensor, or optical (e.g., laser scanning) or non-optical (e.g., millimeter radar) sensors. Such adaptive illumination is increasingly important for automotive (e.g., adaptive headlights), mobile device camera (e.g., adaptive flash), AR, VR, and MR applications such as those described below.

Figure 12A:
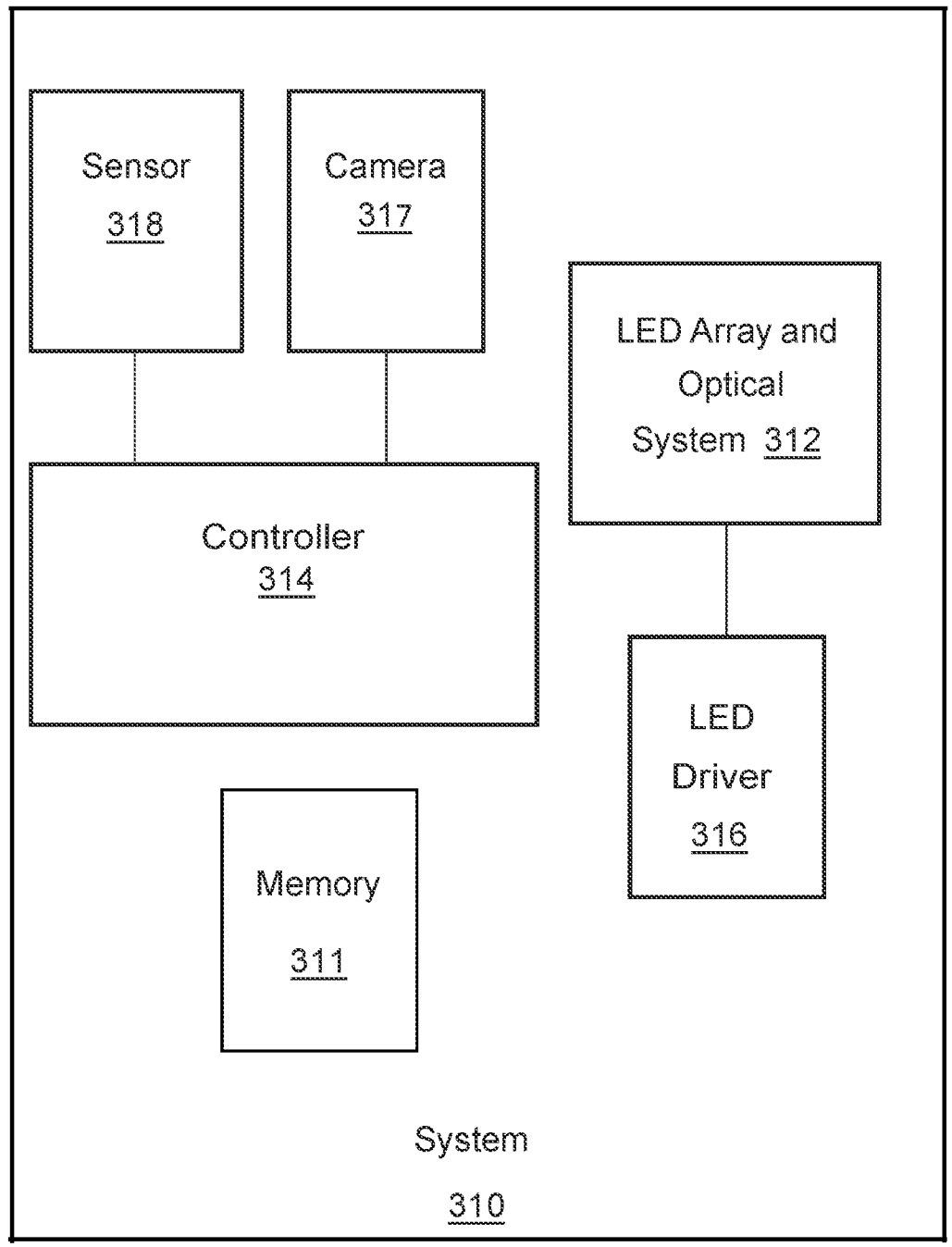
FIG. 12A schematically illustrates an example camera flash system.

FIG. 12A schematically illustrates an example camera flash system 310 comprising an LED or pcLED array and an optical (e.g., lens) system 312, which may be or comprise an adaptive lighting system as described above in which LEDs or pcLEDs in the array may be individually operable or operable as groups. In operation of the camera flash system, illumination from some or all of the LEDs or pcLEDs in array and optical system 312 may be adjusted—deactivated, operated at full intensity, or operated at an intermediate intensity. The array may be a monolithic array, or comprise one or more monolithic arrays, as described above. The array may be a microLED array, as described above.

Flash system 310 also comprises an LED driver 316 that is controlled by a controller 314, such as a microprocessor. Controller 314 may also be coupled to a camera 317 and to sensors 318 and operate in accordance with instructions and profiles stored in memory 311. Camera 317 and LED or pcLED array and lens system 312 may be controlled by controller 314 to, for example, match the illumination provided by system 312 (i.e., the field of view of the illumination system) to the field of view of camera 317, or to otherwise adapt the illumination provided by system 312 to the scene viewed by the camera as described above. Sensors 318 may include, for example, positional sensors (e.g., a gyroscope and/or accelerometer) and/or other sensors that may be used to determine the position and orientation of system 310.

Figure 12B:
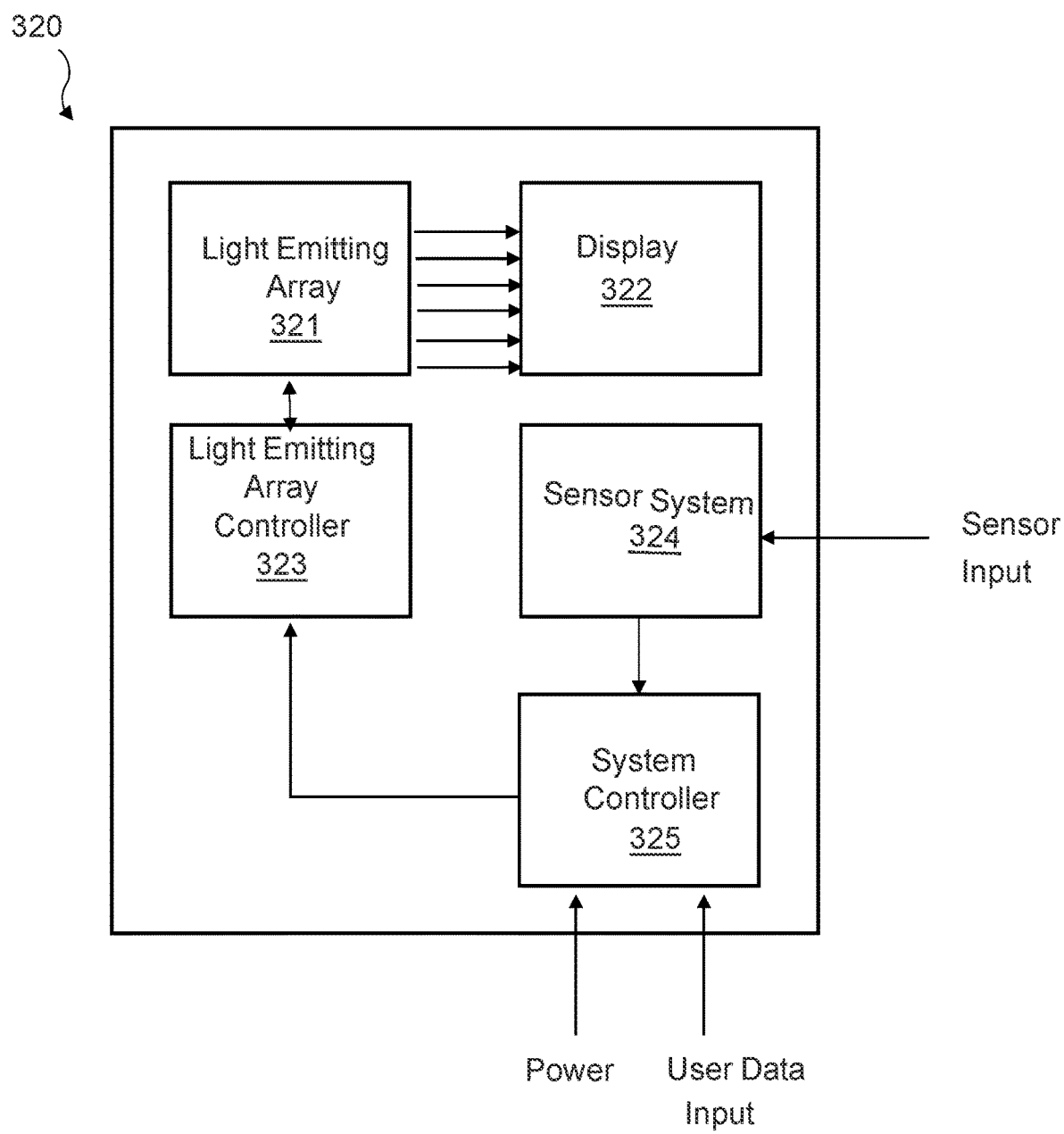
FIG. 12B schematically illustrates an example display system.

FIG. 12B schematically illustrates an example display system 320 that includes an array 321 of LEDs or pcLEDs that are individually operable or operable in groups, a display 322, a light emitting array controller 323, a sensor system 324, and a system controller 325. Array 321 may be a monolithic array, or comprise one or more monolithic arrays, as described above. The array may be monochromatic. Alternatively, the array may be a multicolor array in which different LEDs or pcLEDs in the array are configured to emit different colors of light, as described above. The array may therefore be or comprise a monolithic multicolor matrix of individually operable LED or pcLED light emitters, which may for example be microLEDs as described above. A single individually operable LED or pcLED or a group of adjacent such LEDs or pcLEDs in the array may correspond to a single pixel (picture element) in the display. For example, a group of three individually operable adjacent LEDs or pcLEDs comprising a red emitter, a blue emitter, and a green emitter may correspond to a single color-tunable pixel in the display. Similarly, to provide redundancy in the event of a defective LED or pcLED, a group of six individually operable adjacent LEDs or pcLEDs comprising two red emitters, two blue emitters, and two green emitters may correspond to a single color-tunable pixel in the display Array 321 can be used to project light in graphical or object patterns that can for example support AR/VR/MR systems.

Sensor input is provided to the sensor system 324, while power and user data input is provided to the system controller 325. In some embodiments modules included in system 320 can be compactly arranged in a single structure, or one or more elements can be separately mounted and connected via wireless or wired communication. For example, array 321, display 322, and sensor system 324 can be mounted on a headset or glasses, with the light emitting array controller and/or system controller 325 separately mounted.

System 320 can incorporate a wide range of optics (not shown) to couple light emitted by array 321 into display 322. Any suitable optics may be used for this purpose.

Sensor system 324 can include, for example, external sensors such as cameras, depth sensors, or audio sensors that monitor the environment, and internal sensors such as accelerometers or two or three axis gyroscopes that monitor an AR/VR/MR headset position. Other sensors can include but are not limited to air pressure, stress sensors, temperature sensors, or any other suitable sensors needed for local or remote environmental monitoring. In some embodiments, control input through the sensor system can include detected touch or taps, gestural input, or control based on headset or display position.

In response to data from sensor system 324, system controller 325 can send images or instructions to the light emitting array controller 323. Changes or modification to the images or instructions can also be made by user data input, or automated data input as needed. User data input can include but is not limited to that provided by audio instructions, haptic feedback, eye or pupil positioning, or connected keyboard, mouse, or game controller.

As noted above, AR, VR, and MR systems may be more generally referred to as examples of visualization systems. In a virtual reality system, a display can present to a user a view of scene, such as a three-dimensional scene. The user can move within the scene, such as by repositioning the user's head or by walking. The virtual reality system can detect the user's movement and alter the view of the scene to account for the movement. For example, as a user rotates the user's head, the system can present views of the scene that vary in view directions to match the user's gaze. In this manner, the virtual reality system can simulate a user's presence in the three-dimensional scene. Further, a virtual reality system can receive tactile sensory input, such as from wearable position sensors, and can optionally provide tactile feedback to the user.

In an augmented reality system, the display can incorporate elements from the user's surroundings into the view of the scene. For example, the augmented reality system can add textual captions and/or visual elements to a view of the user's surroundings. For example, a retailer can use an augmented reality system to show a user what a piece of furniture would look like in a room of the user's home, by incorporating a visualization of the piece of furniture over a captured image of the user's surroundings. As the user moves around the user's room, the visualization accounts for the user's motion and alters the visualization of the furniture in a manner consistent with the motion. For example, the augmented reality system can position a virtual chair in a room. The user can stand in the room on a front side of the virtual chair location to view the front side of the chair. The user can move in the room to an area behind the virtual chair location to view a back side of the chair. In this manner, the augmented reality system can add elements to a dynamic view of the user's surroundings.

Figure 12C:
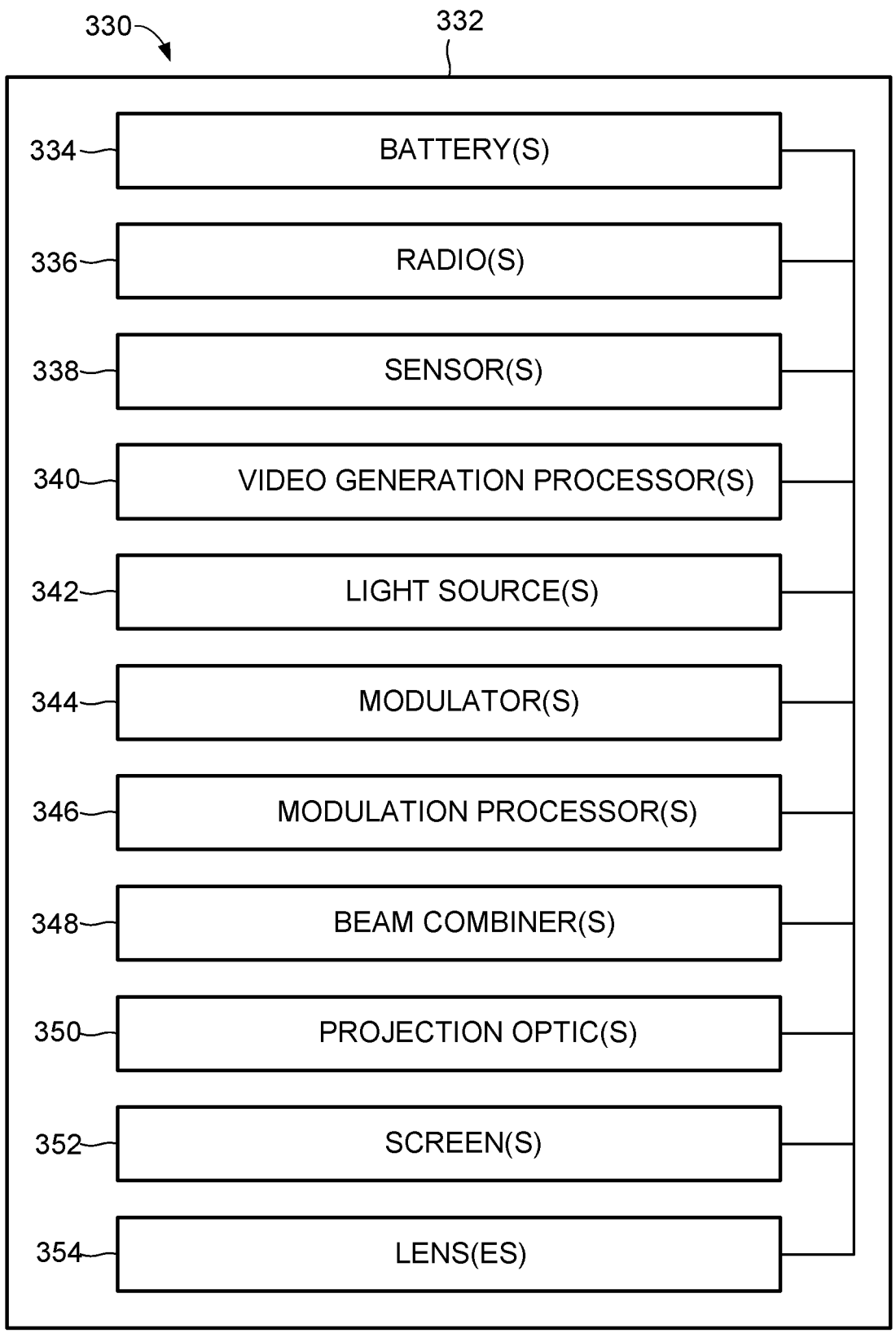
FIG. 12C shows a block diagram of an example visualization system.

FIG. 12C shows a generalized block diagram of an example visualization system 330. The visualization system 330 can include a wearable housing 332, such as a headset or goggles. The housing 332 can mechanically support and house the elements detailed below. In some examples, one or more of the elements detailed below can be included in one or more additional housings that can be separate from the wearable housing 332 and couplable to the wearable housing 332 wirelessly and/or via a wired connection. For example, a separate housing can reduce the weight of wearable goggles, such as by including batteries, radios, and other elements. The housing 332 can include one or more batteries 334, which can electrically power any or all of the elements detailed below. The housing 332 can include circuitry that can electrically couple to an external power supply, such as a wall outlet, to recharge the batteries 334. The housing 332 can include one or more radios 336 to communicate wirelessly with a server or network via a suitable protocol, such as WiFi.

The visualization system 330 can include one or more sensors 338, such as optical sensors, audio sensors, tactile sensors, thermal sensors, gyroscopic sensors, time-of-flight sensors, triangulation-based sensors, and others. In some examples, one or more of the sensors can sense a location, a position, and/or an orientation of a user. In some examples, one or more of the sensors 338 can produce a sensor signal in response to the sensed location, position, and/or orientation. The sensor signal can include sensor data that corresponds to a sensed location, position, and/or orientation. For example, the sensor data can include a depth map of the surroundings. In some examples, such as for an augmented reality system, one or more of the sensors 338 can capture a real-time video image of the surroundings proximate a user.

The visualization system 330 can include one or more video generation processors 340. The one or more video generation processors 340 can receive, from a server and/or a storage medium, scene data that represents a three-dimensional scene, such as a set of position coordinates for objects in the scene or a depth map of the scene. The one or more video generation processors 340 can receive one or more sensor signals from the one or more sensors 338. In response to the scene data, which represents the surroundings, and at least one sensor signal, which represents the location and/or orientation of the user with respect to the surroundings, the one or more video generation processors 340 can generate at least one video signal that corresponds to a view of the scene. In some examples, the one or more video generation processors 340 can generate two video signals, one for each eye of the user, that represent a view of the scene from a point of view of the left eye and the right eye of the user, respectively. In some examples, the one or more video generation processors 340 can generate more than two video signals and combine the video signals to provide one video signal for both eyes, two video signals for the two eyes, or other combinations.

The visualization system 330 can include one or more light sources 342 that can provide light for a display of the visualization system 330. Suitable light sources 342 can include any of the LEDs, pcLEDs, LED arrays, and pcLED arrays discussed above, for example those discussed above with respect to display system 320.

The visualization system 330 can include one or more modulators 344. The modulators 344 can be implemented in one of at least two configurations.

In a first configuration, the modulators 344 can include circuitry that can modulate the light sources 342 directly. For example, the light sources 342 can include an array of light-emitting diodes, and the modulators 344 can directly modulate the electrical power, electrical voltage, and/or electrical current directed to each light-emitting diode in the array to form modulated light. The modulation can be performed in an analog manner and/or a digital manner. In some examples, the light sources 342 can include an array of red light-emitting diodes, an array of green light-emitting diodes, and an array of blue light-emitting diodes, and the modulators 344 can directly modulate the red light-emitting diodes, the green light-emitting diodes, and the blue light-emitting diodes to form the modulated light to produce a specified image.

In a second configuration, the modulators 344 can include a modulation panel, such as a liquid crystal panel. The light sources 342 can produce uniform illumination, or nearly uniform illumination, to illuminate the modulation panel. The modulation panel can include pixels. Each pixel can selectively attenuate a respective portion of the modulation panel area in response to an electrical modulation signal to form the modulated light. In some examples, the modulators 344 can include multiple modulation panels that can modulate different colors of light. For example, the modulators 344 can include a red modulation panel that can attenuate red light from a red light source such as a red light-emitting diode, a green modulation panel that can attenuate green light from a green light source such as a green light-emitting diode, and a blue modulation panel that can attenuate blue light from a blue light source such as a blue light-emitting diode.

In some examples of the second configuration, the modulators 344 can receive uniform white light or nearly uniform white light from a white light source, such as a white-light light-emitting diode. The modulation panel can include wavelength-selective filters on each pixel of the modulation panel. The panel pixels can be arranged in groups (such as groups of three or four), where each group can form a pixel of a color image. For example, each group can include a panel pixel with a red color filter, a panel pixel with a green color filter, and a panel pixel with a blue color filter. Other suitable configurations can also be used.

The visualization system 330 can include one or more modulation processors 346, which can receive a video signal, such as from the one or more video generation processors 340, and, in response, can produce an electrical modulation signal. For configurations in which the modulators 344 directly modulate the light sources 342, the electrical modulation signal can drive the light sources 344. For configurations in which the modulators 344 include a modulation panel, the electrical modulation signal can drive the modulation panel.

The visualization system 330 can include one or more beam combiners 348 (also known as beam splitters 348), which can combine light beams of different colors to form a single multi-color beam. For configurations in which the light sources 342 can include multiple light-emitting diodes of different colors, the visualization system 330 can include one or more wavelength-sensitive (e.g., dichroic) beam splitters 348 that can combine the light of different colors to form a single multi-color beam.

The visualization system 330 can direct the modulated light toward the eyes of the viewer in one of at least two configurations. In a first configuration, the visualization system 330 can function as a projector, and can include suitable projection optics 350 that can project the modulated light onto one or more screens 352. The screens 352 can be located a suitable distance from an eye of the user. The visualization system 330 can optionally include one or more lenses 354 that can locate a virtual image of a screen 352 at a suitable distance from the eye, such as a close-focus distance, such as 500 mm, 750 mm, or another suitable distance. In some examples, the visualization system 330 can include a single screen 352, such that the modulated light can be directed toward both eyes of the user. In some examples, the visualization system 330 can include two screens 352, such that the modulated light from each screen 352 can be directed toward a respective eye of the user. In some examples, the visualization system 330 can include more than two screens 352. In a second configuration, the visualization system 330 can direct the modulated light directly into one or both eyes of a viewer. For example, the projection optics 350 can form an image on a retina of an eye of the user, or an image on each retina of the two eyes of the user.

For some configurations of augmented reality systems, the visualization system 330 can include an at least partially transparent display, such that a user can view the user's surroundings through the display. For such configurations, the augmented reality system can produce modulated light that corresponds to the augmentation of the surroundings, rather than the surroundings itself. For example, in the example of a retailer showing a chair, the augmented reality system can direct modulated light, corresponding to the chair but not the rest of the room, toward a screen or toward an eye of a user.

For purposes of the present disclosure and appended claims, "incidence angle" and "angle of incidence" of light incident on a surface or interface refers to the angle between the propagation direction of the incident light and a vector normal to the surface or interface. Accordingly, light propagating at normal incidence with respect to a surface would have an incidence angle of 0°, while light propagating near grazing incidence with respect to that surface would have an incidence angle approaching 90°. For purposes of the present disclosure and appended claims, the "critical angle" (designated by $\theta_C$) for light incident on a surface or interface between media of differing refractive indices refers to the incidence angle, for light propagating within the higher index medium, above which the light undergoes total internal reflection within the higher-index medium. The critical angle $\theta_C$ therefore defines an escape cone with respect to a given surface or interface, so that light incident outside the escape cone is totally internally reflected and light incident within the escape cone can be transmitted by refraction.

For purposes of the present disclosure and appended claims, "oblique light", "oblique radiation", "obliquely propagating", "lateral light", "lateral radiation", "laterally propagating", and so forth shall refer to light propagating within a substrate, layer, or diode structure at incidence angles greater than $\Theta_C$ with respect a light-exit surface thereof (i.e., outside an escape cone), while "perpendicular light", "perpendicular radiation", "perpendicularly propagating", "vertical light", "vertical radiation", "vertically propagating", and so forth shall refer to light propagating within a substrate, layer, or diode structure at incidence angles less than $\Theta_C$ with respect to that surface (i.e., inside the escape cone), even if not exactly perpendicular to the surface or vertical. "Normal" shall be reserved to describe light incident at an incidence angle substantially equal to 0°.

For purposes of the present disclosure and appended claims, any arrangement of a layer, surface, substrate, diode structure, or other structure "on," "over," or "against" another such structure shall encompass arrangements with direct contact between the two structures as well as arrangements including some intervening structure between them. Conversely, any arrangement of a layer, surface, substrate, diode structure, or other structure "directly on," "directly over," or "directly against" another such structure shall encompass only arrangements with direct contact between the two structures. For purposes of the present disclosure and appended claims, a layer, structure, or material described as "transparent" or "substantially transparent" shall exhibit, at the nominal emission vacuum wavelength $\lambda_0$, a level of optical transmission that is sufficiently high, or a level of optical loss (due to absorption, scattering, or other loss mechanism) that is sufficiently low, that the light-emitting device can function within operationally acceptable parameters (e.g., output power or luminance, conversion or extraction efficiency, or other figures-of-merit including those described below).

An ongoing challenge in designing LED light sources is extraction of light emitted within the LED to escape to propagate outside the device. The semiconductor materials employed have relatively large refractive indices, yielding relatively large Fresnel coefficients and relatively small critical angles $\theta_C$ and correspondingly small escape cones within the LED. It would be desirable to provide a light-emitting element arranged so as to at least partly mitigate those issues.

An inventive light-emitting element 500 (e.g., as in the examples illustrated schematically in FIGS. 7 through 11) includes a semiconductor light-emitting diode (LED), anode and cathode electrical contacts, a lateral dielectric layer, and an electrically conductive bonding layer. The semiconductor LED includes a p-doped semiconductor layer 502b, an n-doped semiconductor layer 502c, and an active, light-emitting layer 502a between the p-doped and n-doped layers 502b/502c. The LED has (i) a light-exit surface 511 of the n-doped layer 502c opposite the active layer 502a, (ii) an anode contact surface 512 of the p-doped layer 502b opposite the active layer 502a, and (iii) one or more side surfaces 513 that laterally confine the p-doped layer 502b, the active layer 502a, and at least a portion of the n-doped layer 502c. In some examples the side surface(s) 513 laterally confine the entire n-doped layer 502c.

In some examples, the LED, including any one or more of its constituent layers 502a/502b/502c, can include one or more doped or undoped III-V, II-VI, or Group IV semiconductor materials or alloys or mixtures thereof. In some examples, the active layer 502a can include one or more p-n junctions, one or more quantum wells, one or more multi-quantum wells, or one or more quantum dots. In some examples the nominal emission vacuum wavelength $\lambda_0$ can be greater than 0.20 μm, greater than 0.4 μm, greater than 0.8 μm, less than 10. μm, less than 2.5 μm, or less than 1.0 μm. In some examples the total nonzero thickness of the layers 502a/502b/502c of the LED can be less than 20. μm, less than 10. μm, less than 5 μm, less than 3 μm, less than 2.0 μm, less than 1.5 μm, or less than 1.0 μm. In some examples the nonzero thickness of the p-doped layer can be less than 2.0 μm, less than 1.0 μm, less than 0.8 μm, less than 0.5 μm, less than 0.3 μm, less than 0.20 μm, or less than 0.10 μm.

The anode electrical contact is positioned on the anode contact surface 512 and is electrically coupled to the p-doped layer 502b; the cathode electrical contact 534 is electrically coupled to the n-doped layer 502c. The lateral dielectric layer 540 is formed on the side surface(s) 513 of the LED. In many examples the dielectric layer 540 covers the side surface(s) 513 somewhat conformally, so that an outer surface of the dielectric layer 540 reproduces the shape of the LED side surface(s) 513. The electrically conductive bonding layer 536 is formed on the lateral dielectric layer 540. The bonding layer is electrically coupled to the anode electrical contact and electrically insulated from the side surface(s) of the active and n-doped layers 502a/502c by the lateral dielectric layer 540. In some examples the bonding layer 536 can include one or more metals or metal alloys, e.g., one or more of aluminum, silver, or gold.

The LED has a side-surface shape characterized by a transverse cross-sectional area that increases monotonically with increasing distance from the anode contact surface 512 of the p-doped layer 502b toward the light-exit surface 511 of the n-doped layer 502c ("transverse" indicating that the plane defining the cross-section is parallel to the light-exit surface 511). In other words, the smallest transverse cross-sectional area of the LED is at the anode contact surface 512 of the p-doped layer 502b, the largest transverse cross-sectional area of the LED is at the light-exit surface 511 of the n-doped layer 502c, and the transverse cross-sectional area varies monotonically between those extremes. The light-exit surface defines an escape cone within the LED (as described above) defined by a critical angle $\theta_C$ that is determined by the refractive indices of the n-doped layer 502c and whatever outside medium is in contact with the light-exit surface 511, e.g., vacuum, air or inert gas, a transparent dielectric substrate, or an encapsulant. The side-surface shape is arranged so that internal reflection within the LED or the lateral dielectric layer 540 redirects a portion of light, emitted by the active layer 502a and propagating within the LED outside the escape cone 599, to propagate toward the exit surface 511 of the n-doped layer 502c within the escape cone 599 (e.g., as in FIGS. 10A/10B). The LED with its shaped side surface(s) 513 therefore acts as a light collector or collimator, redirecting emitted light to exit the LED through the light-exit surface 511 that otherwise might have been trapped within the LED and lost as useful output of the LED.

Figure 8B:
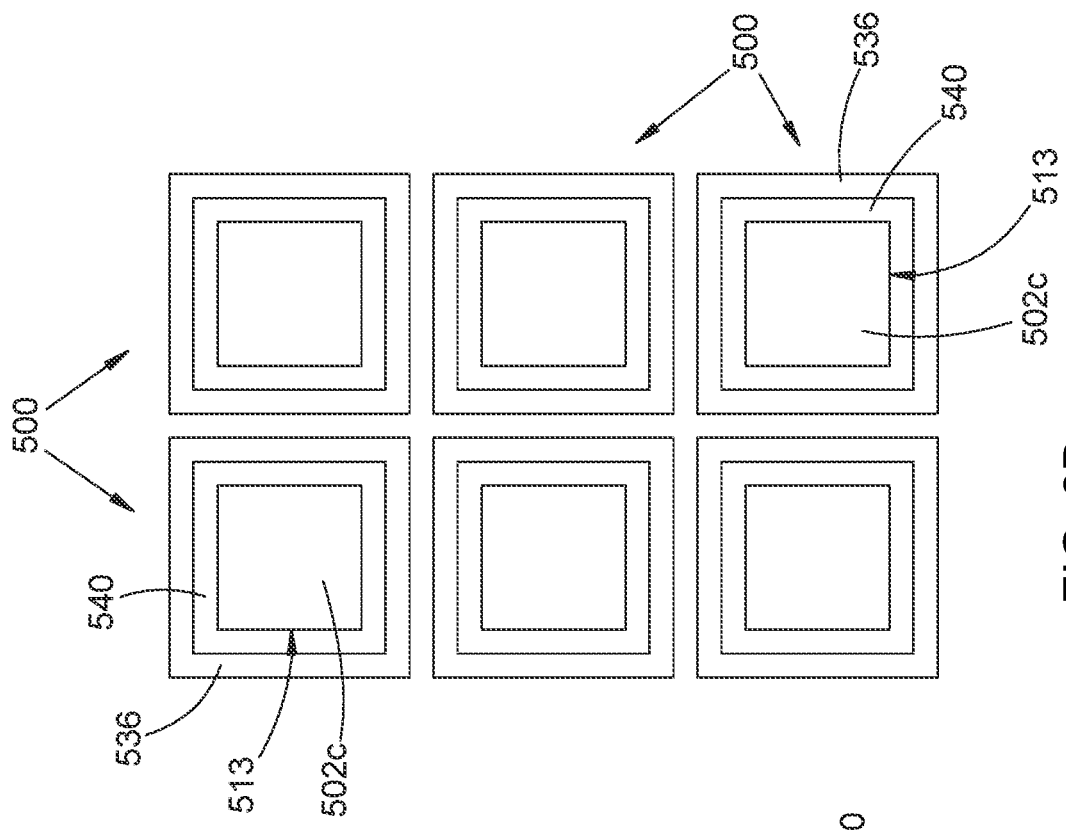
FIGS. 8A and 8B are schematic transverse cross-sectional views of arrays of example light-emitting elements.
Figure 8A:
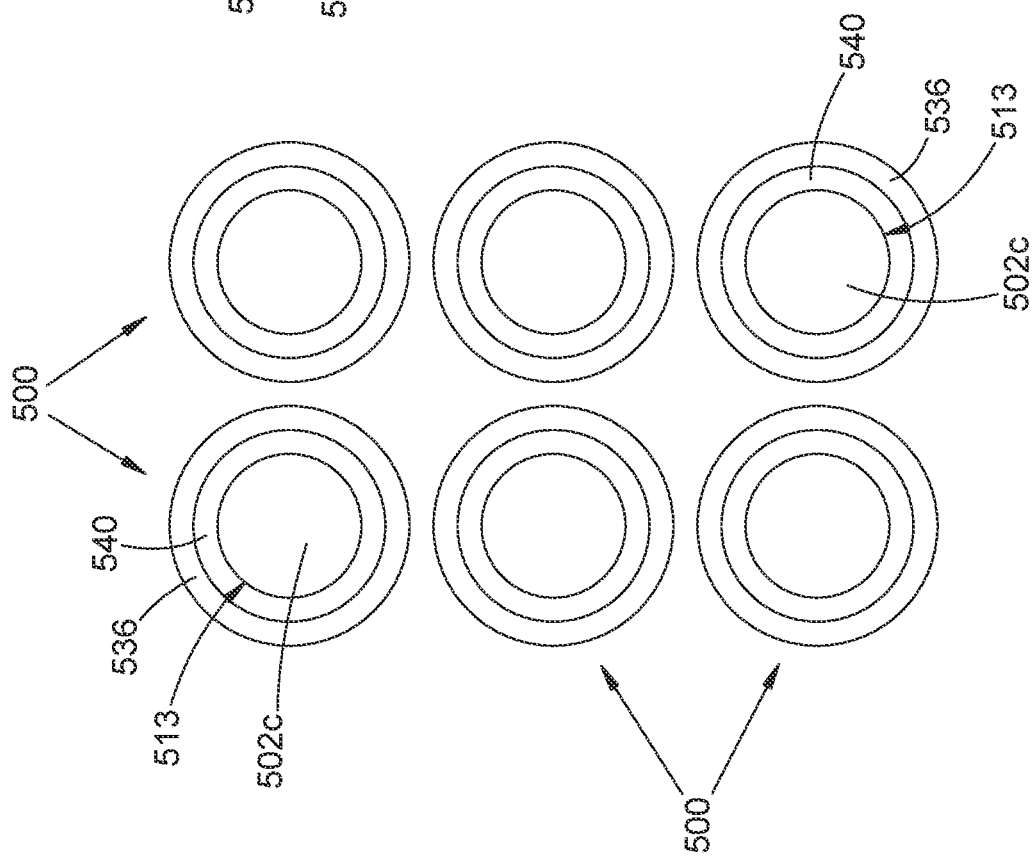

In some examples the LED side surface(s) 513 can have a circular, elliptical, or oval transverse cross-sectional shape (e.g., as in FIG. 8A, illustrating schematically an example array of light-emitting element 500). In some other examples the LED side surface(s) 513 can have a square or rectangular transverse cross-sectional shape (e.g., as in FIG. 8B, illustrating schematically an example array of light-emitting element 500). Other transverse cross-sectional shapes can be employed. In some examples (e.g., as in FIG. 9A) the LED side surface(s) 513 can have a longitudinal cross-sectional shape exhibiting a substantially constant slope between the anode contact surface 512 and the light-exit surface 511 ("longitudinal" indicating that the plane defining the cross-section is perpendicular to the light-exit surface 511). In some other examples (e.g., as in FIG. 9B) the LED side surface(s) can have a longitudinal cross-sectional shape with two or more distinct segments exhibiting constant slopes differing from one another. In some other examples (e.g., as in FIG. 9C) the LED side surface(s) can have a curved longitudinal cross-sectional shape exhibiting a slope that increases monotonically from the anode contact surface to the light-exit surface 511. In some of those examples the slope can increase smoothly; in other examples the side surfaces 513 can exhibit one or more abrupt changes in slope (i.e., forming corners or ridges). Other longitudinal cross-sectional shapes can be employed.

Figure 9A:
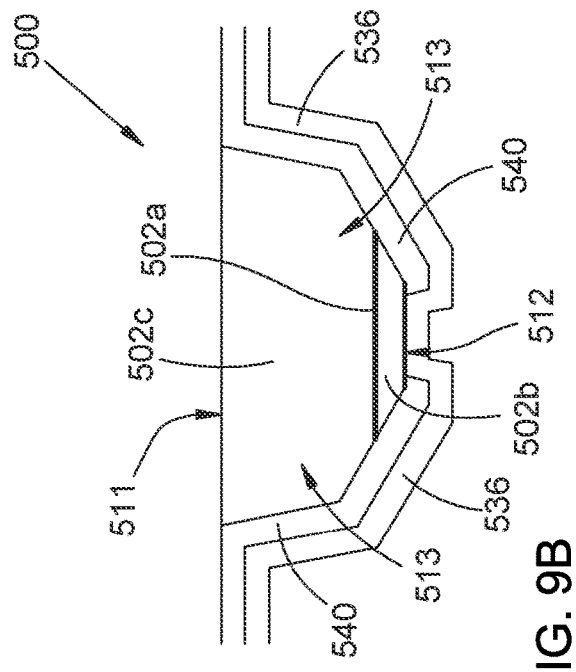
FIGS. 9A-9C are schematic longitudinal cross-sectional views of example light-emitting elements.
Figure 9B:
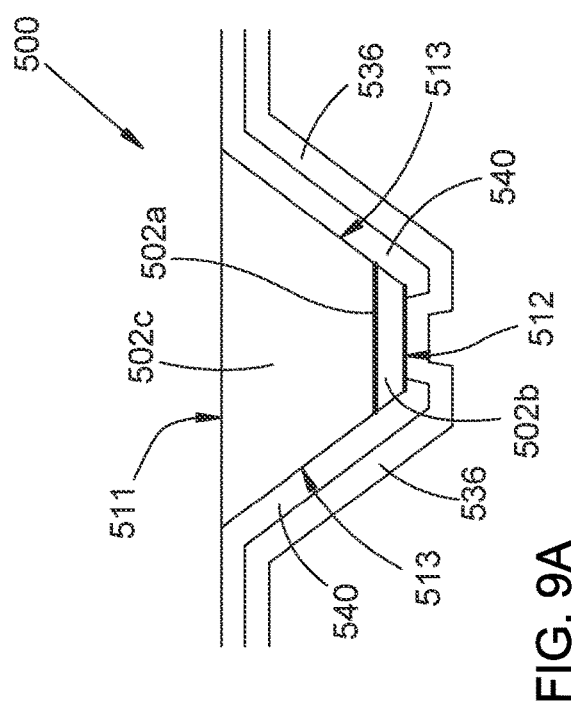
Figure 9C:
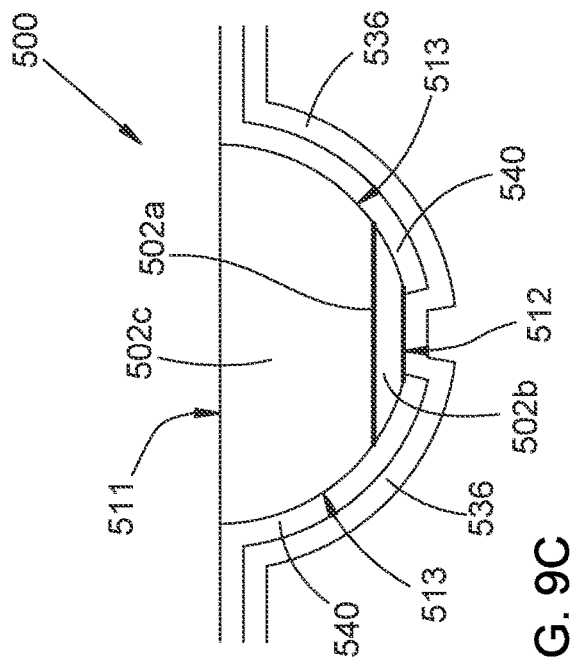
Figure 10A:
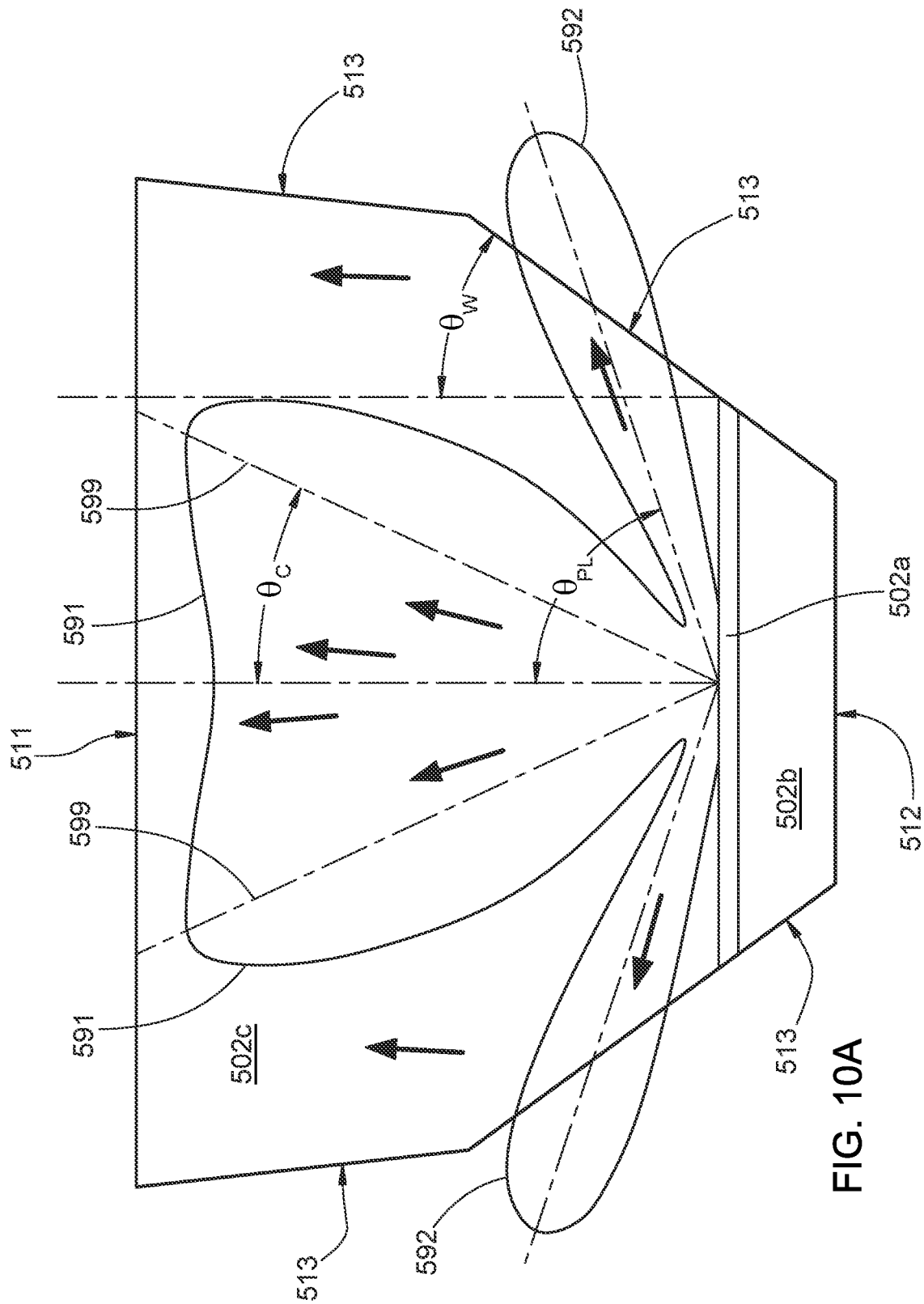
FIGS. 10A and 10B are schematic longitudinal cross-sectional views of example light-emitting elements.
Figure 10B:
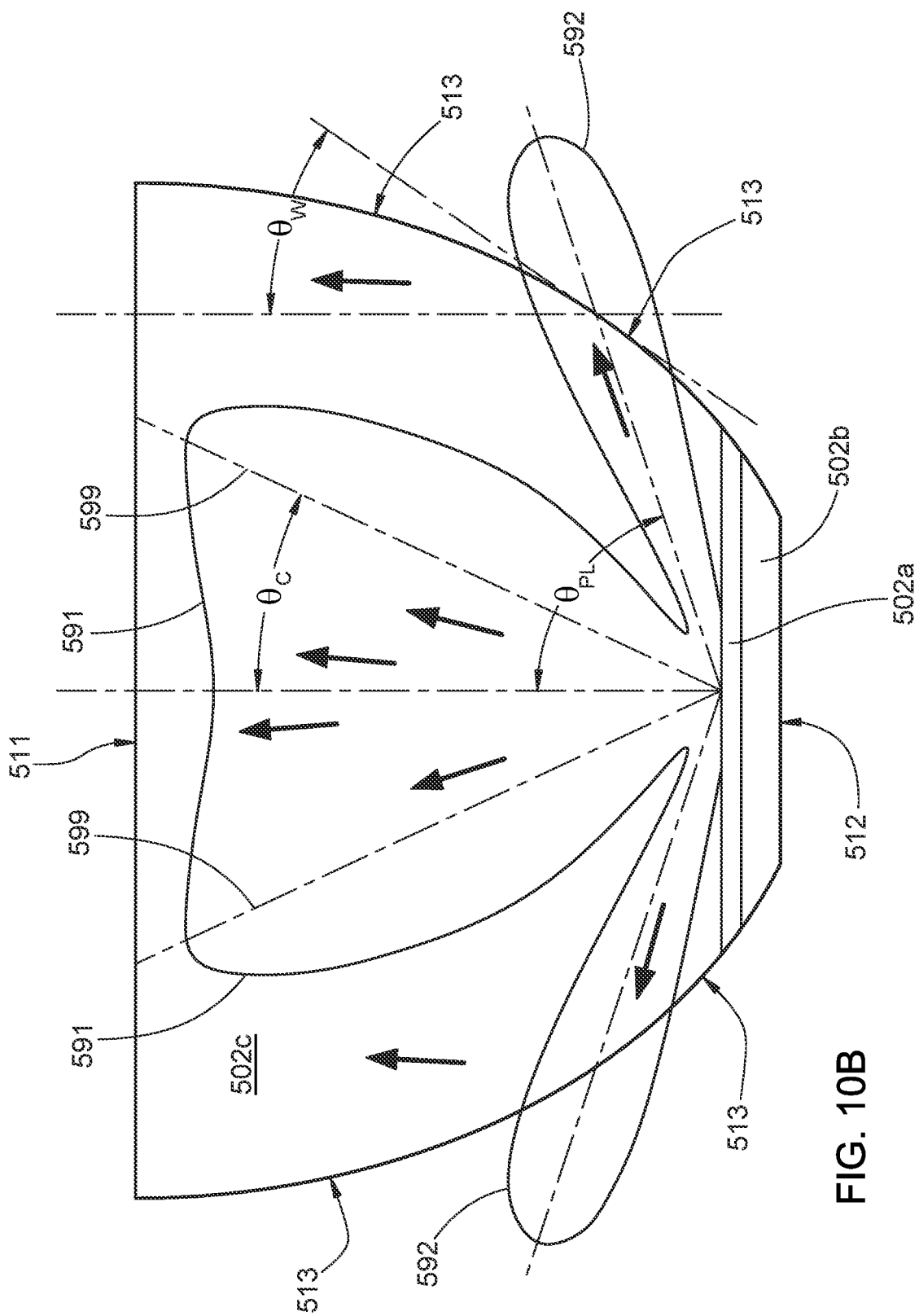

A longitudinal cross-sectional shape having a single constant slope (e.g., as in FIG. 9A) in combination with a circular, elliptical, or oval transverse cross-section shape (e.g., as in FIG. 8A) results in an LED having a shape of a conical frustum; in such arrangements a single continuous side surface 513 laterally confines the semiconductor layers 502a/502b/502c. A longitudinal cross-section shape having a single constant slope (e.g., as in FIG. 9A) in combination with a square, rectangular, or polygonal transverse cross-section shape (e.g., as in FIG. 8B) results in an LED having a shape of a pyramidal frustum; in such examples multiple side surfaces 513 (in the form of planar facets) laterally confine the semiconductor layers 502a/502b/502c. In the examples with two or more distinct segments exhibiting constant slopes differing from one another (e.g., as in FIG. 9B), the resulting LED shape can include stacked conical or pyramidal frusta. In the example of FIG. 9B, the side LED surfaces 513 exhibit a first substantially constant slope at the anode contact surface 512 and a second substantially constant slope, greater than the first, at the light-exit surface 511.

A curved longitudinal cross-sectional shape having smoothly monotonically increasing slope (e.g., as in FIG. 9C) in combination with a circular, elliptical, or oval transverse cross-section shape (e.g., as in FIG. 8A) results in an LED having a shape of a spherical frustum (i.e., a spherical segment), a paraboloidal frustum, a spheroidal frustum, an ellipsoidal frustum, or an ovoidal frustum (i.e., cup-like or bowl-like shapes); in such arrangements a single continuous side surface 513 laterally confines the semiconductor layers 502a/502b/502c. A curved longitudinal cross-sectional shape with one or more abrupt changes in slope (not shown) can form corresponding ridge(s) or corner(s); in such arrangements multiple curved side surfaces 513 laterally confine the semiconductor layers 502a/502b/502c.

In a hypothetical arrangement wherein the layers 502b/502c are infinitely thick and all layers 502a/502b/502c are infinitely wide, the angular distribution of light emission from the active layer 502a is nearly uniform, typically with somewhat higher emission normal to the layers 502a/502b/502c and somewhat lower emission parallel to those layers. Finite thickness of the p-doped layer, and presence of a reflective surface at the anode contact surface 512, alters the emission angular distribution. In a typical arrangement, the emission angular distribution can exhibit a central lobe 591 (centered at normal incidence on the light-exit surface 511) and a peripheral lobe 592 with an emission intensity maximum at a non-normal incidence angle $\theta_{PL}$. In some examples the thickness of the p-doped layer 502b can be selected (sometimes referred to as "tuning the LED cavity") to yield an angular distribution of emitted light within the LED that approximates a specified angular distribution. In some such examples, that specified angular distribution can include a central lobe 591 that is partly, mostly, or entirely within the escape cone 599 and a peripheral lobe 592 that is partly, mostly, or entirely outside the escape cone 599 (e.g., as in FIGS. 10A/10B). In some examples the angular distribution can include multiple peripheral lobes at different corresponding propagation angles.

In previous LEDs the light propagating in the peripheral lobe 592 could become trapped within the LED and lost as useful output of the LED. In an inventive light-emitting element 500, the longitudinal cross-sectional shape of the LED side wall(s) 513 can be arranged to redirect light propagating in the peripheral lobe 592 (or multiple peripheral lobes, if present) to exit through the light-exit surface 511 (e.g., as in FIGS. 10A/10B). In some examples, the LED side surface(s) 513 can be arranged so that emitted light propagating within the peripheral lobe is internally reflected at the LED side surface(s) 513, i.e., the size and shape of the LED are such that the side surface(s) 513 intercept the light propagating in the peripheral lobe 592. In some such examples a region of the LED side surface(s) 513, where light propagating in the peripheral lobe 592 is incident, can be arranged to reflect that light to propagating within the exit cone 599. In some examples that achieve that result, the LED sidewall region can make an acute angle $\theta_W$, relative to a surface normal of the light-exit surface 511, that is between about $(\theta_{PL}-\theta_C)/2$ and about $(\theta_{PL}+\theta_C)/2$; in some examples the angle $\theta_W$ can be about equal to $\theta_{PL}/2$. Note that the slope of the LED sidewall(s) 513 and the angle $\theta_W$ are related in that the slope decreases as the angle $\theta_W$ increases: as $\theta_W$ approaches 90° the slope approaches zero, and as $\theta_W$ approaches 0° the slope tends toward infinity. In some examples, the angle $\theta_W$ can be between 35 degrees and 40. degrees. In some examples wherein the angular distribution includes multiple peripheral lobes, two or more different corresponding LED sidewall regions can be arranged to reflect light from the two or more corresponding peripheral lobes to propagate within the exit cone 599. In some of those examples, each of those sidewall regions can be arranged at an angle chosen based on the propagation angle of the corresponding peripheral lobe, e.g., as described above.

In some examples light incident one the LED side wall(s) 513 can be partly or totally internally reflected at an interface between the lateral dielectric layer 540 and the LED layers 502a/502b/502c; in those examples light transmitted through that interface can be internally reflected at an interface between the lateral dielectric layer 540 and the bonding layer 536, with the bonding layer 536 also acting as a reflector. In some examples the lateral dielectric layer 540 can include one or more materials among: doped or undoped silicon oxide, nitride, or oxynitride; one or more doped or undoped semiconductor oxides, nitrides, or oxynitrides; one or more doped or undoped metal oxides, nitrides, or oxynitrides; one or more optical glasses; or one or more doped or undoped polymers. In some examples the lateral dielectric layer 540 can comprise a single layer of a single dielectric material; in such examples the bonding layer 536 can act as a reflector. In some other examples the lateral dielectric layer 540 can include a reflective coating between the LED side surface(s) 513 and the bonding layer 540. In some examples such a reflective coating can include a multilayer reflective coating (e.g., a distributed Bragg reflector (DBR)); in some examples the reflective layer can include one or more materials among: one or more metals or metal alloys; doped or undoped silicon; one or more doped or undoped III-V, II-VI, or Group IV semiconductors; doped or undoped silicon oxide, nitride, or oxynitride; one or more doped or undoped semiconductor oxides, nitrides, or oxynitrides; one or more doped or undoped metal oxides, nitrides, or oxynitrides; one or more optical glasses; or one or more doped or undoped polymers.

In some examples the anode electrical contact can be formed by a portion of the bonding layer 536 that is in direct electrical contact with the anode contact surface 512 of the p-doped layer 502b. In some other examples the anode electrical contact can include one or more electrically conductive anode electrode layers (i) between the bonding layer 536 and the anode contact surface 512 and (ii) electrically coupling the bonding layer 536 to the p-doped layer 502b. In some examples the one or more anode electrode layers can include a layer 542 of one or more metals or metal alloys, e.g., one or more of aluminum, silver, or gold. In some examples the one or more anode electrode layers can include a transparent electrode layer 544. In some of those examples, the transparent electrode 544 can be in direct contact with the anode contact surface 512 and the bonding layer 536; in some others of those examples the transparent electrode 544 can be in direct contact with the anode contact surface 512 and with a metallic electrode 542 that is between the transparent electrode layer 544 and the bonding layer 536 (e.g., as in FIG. 7). In some examples the transparent electrode layer 544 can include one or more of indium tin oxide, indium zinc oxide, one or more other transparent conductive oxides, or combinations or mixtures thereof.

In some examples the cathode electrical contact can include including one or more edge contacts or one or more peripheral areal contacts (not shown). In some examples the cathode electrical contact can include one or more electrically conductive vias (not shown) electrically insulated from the bonding layer 536; each such via can provide a localized, circumscribed electrical connection to the n-doped layer 502c. In some examples edge contacts, peripheral areal contacts, or vias can include one or more metals or metal alloys, e.g., one or more of aluminum, silver, or gold. In some examples the cathode electrical contact can include a transparent cathode electrode layer 534 on the light-exit surface 511 of the n-doped layer 502c. In some of those examples the transparent cathode electrode layer 534 can include one or more of indium tin oxide, indium zinc oxide, one or more other transparent conductive oxides, or combinations or mixtures thereof.

In some examples, the light-exit surface 511 of the n-doped layer 502c can include an anti-reflection coating arranged so as to reduce Fresnel reflection of emitted light at the nominal emission vacuum wavelength $\lambda_o$ incident on that surface. Any suitable anti-reflection coating can be employed, e.g., a single quarter-wave layer, a multilayer dielectric stack, a so-called moth's-eye structure, and so forth, and can be suitably arranged based on the refractive indices of the n-doped layer 502c and a medium positioned against the light-exit surface 511.

Figure 11:
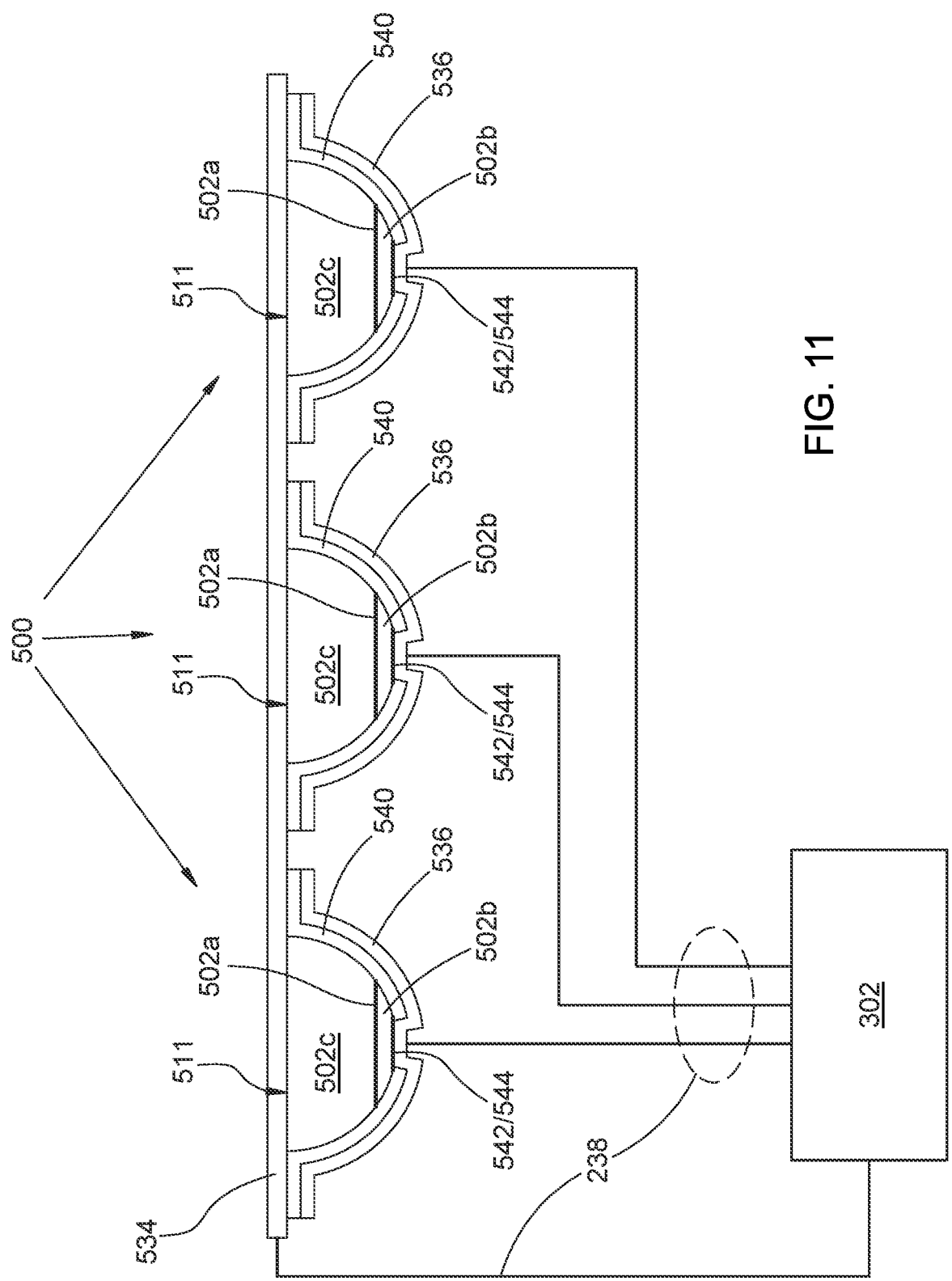
FIG. 11 is a schematic longitudinal cross-sectional view of an array of example light emitting elements.

In some examples multiple light-emitting elements 500 can be arranged as a light-emitting array (e.g., as in FIGS. 8A, 8B, and 11). The multiple light-emitting elements 500 can be arranged in the array with their corresponding light-exit surfaces 511 in a substantially coplanar arrangement. The example array shown in FIG. 11 includes multiple light-emitting elements 500 arranged as in FIG. 7. Inventive light-emitting elements 500 of any other suitable arrangement (e.g., as in FIGS. 9A, 9B, 9C, 10A, or 10B) can be similarly incorporated into an array.

In some examples the multiple light-emitting elements 500 can comprise discrete, structurally distinct elements assembled together to form the array. In some other examples the multiple light-emitting elements 500 of the array can be integrally formed together on a common substrate. In some integrally formed examples, the corresponding n-doped layers 502c of the LEDs can form a single, continuous n-doped layer spanning the array. In some other integrally formed or assembled examples, the corresponding n-doped layers of the LEDs can be separated from one another with no direct electrical coupling between them.

In some examples of an array, the nonzero spacing of the light-emitting elements 500 can be less than 1.0 mm, less than 0.5 mm, less than 0.33 mm, less than 0.20 mm, less than 0.10 mm, less than 0.08 mm, less than 0.05 mm, less than 0.033 mm, less than 0.020 mm, or less than 0.010 mm. In some examples the nonzero separation between adjacent light-emitting elements 500 of the array can be less than 50 µm, less than 20. µm, less than 10. µm, less than 5 µm, less than 2.0 µm, less than 1.0 µm, or less than 0.5 µm. In some examples the light-emitting elements 500 of the array can exhibit a contrast ratio for emitted light exiting from adjacent light-emitting elements that is greater than 5:1, greater than 10:1, greater than 20:1, greater than 50:1, greater than 100:1, or greater than 300:1.

In some examples the light-emitting element 500, or some or all of multiple light-emitting elements 500 of an array, can be arranged to act as a direct emitter, i.e., light emitted from the junction or active layer 502a being the output of the element 500. In some examples (not shown) the light-emitting element 500, or some or all of multiple light-emitting elements 500 of an array, can include one or more wavelength-converting structures (e.g., phosphor wavelength converters), so that output from the element includes down-converted light emitted by the wavelength-converting structure (with or without residual light emitted by the junction or active layer 502a). In some examples of arrays of such wavelength-converted light-emitting elements 500, the wavelength-converting structures can all emit at the same one or more wavelengths; in other array examples wavelength-converting structures of some elements 500 can emit at wavelengths different from those emitted by wavelength-converting structures of some other light-emitting elements 500. In some array examples the wavelength-converting structures can be arranged as discrete elements on each light-emitting element 500; in some other examples the wavelength-converting structures can be corresponding areas of a contiguous layer over multiple light-emitting elements 500, or over all of the light-emitting elements 500.

In some examples a set of multiple independent electrically conductive traces or interconnects 238 can be connected to the corresponding anode electrical contacts, with each anode electrical contact being connected to a single corresponding one of the traces or interconnects 238 that is different from a corresponding trace or interconnect 238 connected to at least one other anode electrical contact. In some examples each anode electrical contact can be connected to a single corresponding one of the traces or interconnects 238 that is different from a corresponding trace or interconnect connected 238 to all other anode electrical contacts. In some examples the one or more electrically conductive traces or interconnects 238 can include one or more metals or metal alloys, e.g., one or more of aluminum, silver, or gold.

In some examples a drive circuit 302 can be connected to each of the cathode electrical contacts, and to each of the anode electrical contacts by the electrical traces or interconnects 238. In some examples the drive circuit 302 can be being structured and connected so as to provide electrical drive current that flows through the array and causes the array to emit light, and that is further structured and connected so that (i) corresponding portions of the electrical drive current flow through one or more corresponding LEDs as corresponding pixel currents, and (ii) each pixel current magnitude differs from the corresponding pixel current magnitude of at least one other of the LEDs of the array. In some examples differing spatial distributions of pixel current magnitudes to the elements 500 of the array can result in corresponding different spatial distributions of light emission intensity across the array.

Design or optimization one or more or all of, inter alia, the semiconductor layers 502a/502b/502c (e.g., refractive indices, thicknesses, doping levels), diode size or shape (e.g., aspect ratio of total semiconductor layer thickness to width of light-exit surface 511, ratio of widths of the light-exit surface 511 to anode contact surface 512, slope, slope variation, or curvature of side surface(s) 513), or the lateral dielectric layer 540 (e.g., thickness, refractive index, reflector structure) can be performed (by calculation, simulation, or iterative designing/making/testing of prototypes or test devices) based on one or more selected figures-of-merit (FOMs). Device-performance-based FOMs that can be considered can include, e.g.: (i) extraction efficiency; (ii) total radiated emission; (iii) radiated angular distribution of the emitted light; (iv) fraction of radiated emission within a selected cone angle; (v) contrast ratio for light emission between adjacent light-emitting elements 500 in an array, or (vi) other suitable or desirable FOMs. Instead or in addition, reduction of cost or manufacturing complexity can be employed as an FOM in a design or optimization process. Optimization for one FOM can result in non-optimal values for one or more other FOMs. Note that a device that is not necessarily fully optimized with respect to any FOM can nevertheless provide acceptable enhancement of one or more FOMs; such partly optimized devices fall within the scope of the present disclosure or appended claims.

In addition to the preceding, the following example embodiments fall within the scope of the present disclosure or appended claims:

Example 1. A light-emitting element comprising: (a) a semiconductor light-emitting diode (LED) that includes a p-doped semiconductor layer, an n-doped semiconductor layer, and an active, light-emitting layer between the p-doped and n-doped layers, the LED having (i) a light-exit surface of the n-doped layer opposite the active layer, (ii) an anode contact surface of the p-doped layer opposite the active layer, and (iii) one or more side surfaces that laterally confine the p-doped layer, the active layer, and at least a portion of the n-doped layer; (b) an anode electrical contact on the anode contact surface and electrically coupled to the p-doped layer; (c) a cathode electrical contact electrically coupled to the n-doped layer; (d) a lateral dielectric layer on the one or more side surfaces of the LED; and (e) an electrically conductive bonding layer on the lateral dielectric layer, the bonding layer being electrically coupled to the anode electrical contact and electrically insulated from side surfaces of the active and n-doped layers by the lateral dielectric layer, (f) the LED having a side-surface shape characterized by a cross-sectional area that increases monotonically with increasing distance from the anode contact surface of the p-doped layer toward the light-exit surface of the n-doped layer, the side-surface shape being arranged so that internal reflection within the LED or lateral dielectric layer redirects a portion of light emitted by the active layer and propagating within the LED outside an escape cone to propagate toward the exit surface of the n-doped layer within the escape cone.

Example 2. The light-emitting element of Example 1, the one or more LED side surfaces laterally confining the entire n-doped layer.

Example 3. The light-emitting element of any one of Examples 1 or 2, the LED having a circular, elliptical, or oval transverse cross-sectional shape.

Example 4. The light-emitting element of any one of Examples 1 or 2, the LED having a square, rectangular, or polygonal transverse cross-sectional shape.

Example 5. The light-emitting element of any one of Examples 1 through 4, the one or more LED side surfaces having a longitudinal cross-sectional shape exhibiting a substantially constant slope between the anode contact surface and the light-exit surface.

Example 6. The light-emitting element of any one of Examples 1 through 4, the one or more LED side surfaces having a longitudinal cross-sectional shape exhibiting a first substantially constant slope at the anode contact surface and a second substantially constant slope, greater than the first, at the light-exit surface.

Example 7. The light-emitting element of any one of Examples 1 through 4, the one or more LED side surfaces having a curved longitudinal cross-sectional shape exhibiting a slope that increases monotonically from the anode contact surface to the light-exit surface.

Example 8. The light-emitting element of any one of Examples 1 through 7, light emitted from the active layer exhibiting an angular distribution that includes a central lobe at least partly within an escape cone and a peripheral lobe outside the escape cone, the one or more LED side surfaces being arranged so that emitted light propagating within the peripheral lobe is internally reflected at the one or more LED side surfaces.

Example 9. The light emitting element of Example 8, the one or more LED side surfaces having a longitudinal cross-sectional shape being arranged so that, in a region thereof where emitted light propagating in the peripheral lobe is incident on the one or more side surfaces, that side surface region makes an acute angle $\theta_W$, relative to a surface normal of the light-exit surface, that is between about $(\theta_{PL}-\theta_C)/2$ and about $(\theta_{PL}+\theta_C)/2$, $\theta_{PL}$ being the acute angle of light propagation at the maximum of the peripheral lobe relative to the surface normal, $\theta_C$ being a cone angle of the escape cone.

Example 10. The light emitting element of Example 8, the one or more LED side surfaces having a longitudinal cross-sectional shape arranged so that, in a region thereof where emitted light propagating in the peripheral lobe is incident on the one or more side surfaces, that side surface region makes an acute angle $\theta_W$, relative to a surface normal of the light-exit surface, that is about equal to $\theta_{PL}/2$, $\theta_{PL}$ being the acute angle of light propagation at the maximum of the peripheral lobe relative to the surface normal, $\theta_C$ being a cone angle of the escape cone.

Example 11. The light-emitting element of Example 8, the one or more LED side surfaces having a longitudinal cross-sectional shape arranged so that, in a region thereof where emitted light propagating in the peripheral lobe is incident on the one or more side surfaces, that side surface region makes an acute angle $\theta_W$, relative to a surface normal of the light-exit surface, that is between 35 degrees and 40. degrees.

Example 12. The light-emitting element of any one of Examples 1 through 11, the bonding layer including one or more metals or metal alloys.

Example 13. The light-emitting element of Example 13, the bonding layer including one or more of aluminum, silver, or gold.

Example 14. The light-emitting element of any one of Examples 1 through 13, the lateral dielectric layer including one or more materials among: doped or undoped silicon oxide, nitride, or oxynitride; one or more doped or undoped semiconductor oxides, nitrides, or oxynitrides; one or more doped or undoped metal oxides, nitrides, or oxynitrides; one or more optical glasses; or one or more doped or undoped polymers.

Example 15. The light-emitting element of any one of Examples 1 through 14, the lateral dielectric layer comprising only a single layer of a single dielectric material.

Example 16. The light-emitting element of any one of Examples 1 through 14, the lateral dielectric layer including a reflective coating between the one or more LED side surfaces and the bonding layer.

Example 17. The light-emitting element of Example 16, the reflective coating including a multilayer reflective coating or a distributed Bragg reflector (DBR).

Example 18. The light-emitting element of any one of Examples 16 or 17, the reflective coating including one or more materials among: one or more metals or metal alloys; doped or undoped silicon; one or more doped or undoped III-V, II-VI, or Group IV semiconductors; doped or undoped silicon oxide, nitride, or oxynitride; one or more doped or undoped semiconductor oxides, nitrides, or oxynitrides; one or more doped or undoped metal oxides, nitrides, or oxynitrides; one or more optical glasses; or one or more doped or undoped polymers.

Example 19. The light-emitting element of any one of Examples 1 through 18, the anode electrical contact including one or more electrically conductive anode electrode layers (i) between the bonding layer and the anode contact surface and (ii) electrically coupling the bonding layer to the p-doped layer.

Example 20. The light-emitting element of Example 19, the one or more anode electrode layers including a metallic layer of one or more metals or metal alloys.

Example 21. The light-emitting element of Example 20, the one or more anode electrode layers including a metallic layer of one or more of aluminum, silver, or gold.

Example 22. The light-emitting element of any one of Examples 20 or 21, the one or more anode electrode layers including a transparent electrode layer between the anode contact surface and the metallic layer.

Example 23. The light-emitting element of Example 19, the one or more anode electrode layers including a transparent electrode layer.

Example 24. The light-emitting element of any one of Examples 22 or 23, the transparent electrode layer including one or more of indium tin oxide, indium zinc oxide, one or more other transparent conductive oxides, or combinations or mixtures thereof.

Example 25. The light-emitting element of any one of Examples 1 through 18, the anode electrical contact being a portion of the bonding layer in direct electrical contact with the anode surface of the p-doped layer.

Example 26. The light-emitting element of any one of Examples 1 through 25, the cathode electrical contact including a transparent cathode electrode layer on the light-exit surface of the n-doped layer.

Example 27. The light-emitting element of Example 26, the transparent cathode electrode layer including one or more of indium tin oxide, indium zinc oxide, one or more other transparent conductive oxides, or combinations or mixtures thereof.

Example 28. The light-emitting element of any one of Examples 1 through 27, the cathode electrical contact including one or more edge contacts or one or more peripheral areal contacts.

Example 29. The light-emitting element of any one of Examples 1 through 28, the cathode electrical contact including one or more electrically conductive vias electrically insulated from the bonding layer.

Example 30. The light-emitting element of any one of Examples 28 or 29, the one or more edge contacts, peripheral areal contacts, or vias of the cathode electrical contact including one or more metals or metal alloys.

Example 31. The light-emitting element of Example 30, the one or more edge contacts, peripheral areal contacts, or vias of the cathode electrical contact including one or more of aluminum, silver, or gold.

Example 32. The light-emitting element of any one of Examples 1 through 31, further comprising an anti-reflection coating on the exit surface of the n-doped layer, arranged so as to reduce reflection of emitted light at the nominal emission vacuum wavelength $\lambda_0$ incident on that surface, relative to reflection at a similar surface lacking the anti-reflection coating.

Example 33. The light-emitting element of any one of Examples 1 through 32, the LED including one or more doped or undoped III-V, II-VI, or Group IV semiconductor materials or alloys or mixtures thereof.

Example 34. The light-emitting array of any one of Examples 1 through 33, the nominal emission vacuum wavelength $\lambda_0$ being greater than 0.20 μm, greater than 0.4 μm, greater than 0.8 μm, less than 10. μm, less than 2.5 μm, or less than 1.0 μm.

Example 35. The light-emitting element of any one of Examples 1 through 34, the active layer including one or more p-n junctions, one or more quantum wells, one or more multi-quantum wells, or one or more quantum dots.

Example 36. The light-emitting element of any one of Examples 1 through 35, total nonzero thickness of the layers of the LED being less than 20. μm, less than 10. μm, less than 5 μm, less than 3 μm, less than 2.0 μm, less than 1.5 μm, or less than 1.0 μm.

Example 37. The light-emitting element of any one of Examples 1 through 36, nonzero thickness of the p-doped layer being less than 2.0 µm, less than 1.0 µm, less than 0.8 µm, less than 0.5 µm, less than 0.3 µm, less than 0.20 µm, or less than 0.10 µm.

Example 38. The light-emitting element of any one of Examples 1 through 37, nonzero thickness of the p-doped layer being selected so as to result in an angular distribution of emitted light within the LED that approximates a specified angular distribution.

Example 39. The light emitting element of Example 38, the specified angular distribution including a central lobe at least partly within an escape cone and a peripheral lobe outside the escape cone.

Example 40. A method for making the light-emitting element of any one of Examples 1 through 39, the method comprising: (A) forming the first and second semiconductor layers with the junction or active layer between them; (B) forming the dielectric bodies on the first semiconductor layer; (C) forming the set of first electrical contacts in electrical contact with the first semiconductor layer; and (D) forming the set of second electrical contacts in electrical contact with the second semiconductor layer.

Example 41. A light-emitting array comprising multiple light-emitting elements of any one of Examples 1 through 39 arranged with corresponding light-exit surfaces thereof in a substantially coplanar arrangement.

Example 42. The light-emitting array Example 41, the multiple light-emitting elements of the array being integrally formed together on a common substrate.

Example 43. The light-emitting array of Example 42, the corresponding n-doped layers of the LEDs forming a single, continuous n-doped layer spanning the array.

Example 44. The light-emitting array of Example 41, the multiple light-emitting elements comprising discrete, structurally distinct elements assembled together to form the array.

Example 45. The light-emitting array of any one of Examples 42 or 44, the corresponding n-doped layers of the LEDs being separated from one another with no direct electrical coupling between corresponding n-doped layers thereof.

Example 46. The light-emitting array of any one of Examples 41 through 45, nonzero spacing of the light-emitting elements of the array being less than 1.0 mm, less than 0.5 mm, less than 0.33 mm, less than 0.20 mm, less than 0.10 mm, less than 0.08 mm, less than 0.05 mm, less than 0.033 mm, less than 0.020 mm, or less than 0.010 mm.

Example 47. The light-emitting array of any one of Examples 41 through 46, nonzero separation between adjacent light-emitting elements of the array being less than 50 µm, less than 20. µm, less than 10. µm, less than 5 µm, less than 2.0 µm, less than 1.0 µm, or less than 0.5 µm.

Example 48. The light-emitting array of any one of Examples 41 through 47, the light-emitting elements of the array exhibiting a contrast ratio for emitted light exiting from adjacent light-emitting elements that is greater than 5:1, greater than 10:1, greater than 20:1, greater than 50:1, greater than 100:1, or greater than 300:1.

Example 49. The light-emitting array of any one of Examples 41 through 48, further comprising a set of multiple independent electrically conductive traces or interconnects connected to the corresponding anode electrical contacts, each anode electrical contact being connected to a single corresponding one of the traces or interconnects that is different from a corresponding trace or interconnect connected to at least one other anode electrical contact.

Example 50. The light-emitting element of Example 49, the one or more electrically conductive traces or interconnects including one or more metals or metal alloys.

Example 51. The light-emitting element of Example 50, the one or more electrically conductive traces or interconnects including one or more of aluminum, silver, or gold.

Example 52. The light-emitting array of any one of Examples 49 through 51, each anode electrical contact being connected to a single corresponding one of the traces or interconnects that is different from corresponding traces or interconnects connected to all other anode electrical contacts.

Example 53. The light-emitting array of any one of Examples 49 through 52, further comprising a drive circuit (i) connected to each of the cathode electrical contacts, and (ii) connected to each of the anode electrical contacts by the electrical traces or interconnects, the drive circuit being structured and connected so as to provide electrical drive current that flows through the array and causes the array to emit light, and that is further structured and connected so that (i) corresponding portions of the electrical drive current flow through one or more corresponding LEDs as corresponding pixel currents, and (ii) each pixel current magnitude differs from the corresponding pixel current magnitude of at least one other of the LEDs of the array.

Example 54. A method for using the light-emitting array of Example 53, the method comprising: (A) selecting a first specified spatial distribution of pixel current magnitudes; (B) operating the drive circuit to provide the first specified spatial distribution of pixel current magnitudes to the LEDs of the array, causing the array to emit light according to a corresponding first spatial distribution of light emission intensity across the array; (C) selecting a second specified spatial distribution of pixel current magnitudes that differs from the first specified spatial distribution of pixel current magnitudes; and (D) operating the drive circuit to provide the second specified spatial distribution of pixel current magnitudes to the LEDs of the array, causing the array to emit light according to a corresponding second spatial distribution of light emission intensity across the array that differs from the first spatial distribution of light emission intensity.

Example 55. A method for making the light-emitting array of Example 53, the method comprising: (A) forming or assembling the multiple light-emitting elements to form the array; (B) forming one or more electrical traces or interconnects connected to the corresponding anode electrical contacts; and (C) connecting the drive circuit (i) to the corresponding anode electrical contacts using the electrical traces or interconnects, and (ii) to the corresponding cathode electrical contacts.

This disclosure is illustrative and not limiting. Further modifications will be apparent to one skilled in the art in light of the present disclosure and are intended to fall within the scope of the present disclosure or appended claims. It is intended that equivalents of the disclosed example embodiments and methods, or modifications thereof, shall fall within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Therefore, the present disclosure shall be construed as implicitly disclosing any embodiment having any suitable subset of one or more features—which features are shown, described, or claimed in the present application—including those subsets that may not be explicitly disclosed herein. A "suitable" subset of features includes only features that are neither incompatible nor mutually exclusive with respect to any other feature of that subset. Accordingly, the appended claims are hereby incorporated in their entirety into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The words "comprising," "including," "having," and variants thereof, wherever they appear, shall be construed as open ended terminology, with the same meaning as if a phrase such as "at least" were appended after each instance thereof, unless explicitly stated otherwise. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively unless: (i) it is explicitly stated otherwise, e.g., by use of "either . . . or," "only one of," or similar language; or (ii) two or more of the listed alternatives are understood or disclosed (implicitly or explicitly) to be incompatible or mutually exclusive within the particular context. In that latter case, "or" would be understood to encompass only those combinations involving non-mutually-exclusive alternatives. In one example, each of "a dog or a cat," "one or more of a dog or a cat," and "one or more dogs or cats" would be interpreted as one or more dogs without any cats, or one or more cats without any dogs, or one or more of each. In another example, each of "a dog, a cat, or a mouse," "one or more of a dog, a cat, or a mouse," and "one or more dogs, cats, or mice" would be interpreted as (i) one or more dogs without any cats or mice, (ii) one or more cats without and dogs or mice, (iii) one or more mice without any dogs or cats, (iv) one or more dogs and one or more cats without any mice, (v) one or more dogs and one or more mice without any cats, (vi) one or more cats and one or more mice without any dogs, or (vii) one or more dogs, one or more cats, and one or more mice. In another example, each of "two or more of a dog, a cat, or a mouse" or "two or more dogs, cats, or mice" would be interpreted as (i) one or more dogs and one or more cats without any mice, (ii) one or more dogs and one or more mice without any cats, (iii) one or more cats and one or more mice without and dogs, or (iv) one or more dogs, one or more cats, and one or more mice; "three or more," "four or more," and so on would be analogously interpreted.

For purposes of the present disclosure or appended claims, when a numerical quantity is recited (with or without terms such as "about," "about equal to," "substantially equal to," "greater than about," "less than about," and so forth), standard conventions pertaining to measurement precision, rounding error, and significant digits shall apply, unless a differing interpretation is explicitly set forth. For null quantities described by phrases such as "substantially prevented," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A light-emitting element comprising:
  a semiconductor light-emitting diode (LED) that includes
    a p-doped semiconductor layer, an n-doped semiconductor layer, and an active, light-emitting layer between the p-doped and n-doped layers, the LED having (i) a light-exit surface of the n-doped layer opposite the active layer, (ii) an anode contact surface of the p-doped layer opposite the active layer, and (iii) one or more side surfaces that laterally confine the p-doped layer, the active layer, and at least a portion of the n-doped layer;
  an anode electrical contact on the anode contact surface and electrically coupled to the p-doped layer;
  a cathode electrical contact electrically coupled to the n-doped layer;
  a lateral dielectric layer on the one or more side surfaces of the LED; and
  an electrically conductive bonding layer on the lateral dielectric layer, the bonding layer being electrically coupled to the anode electrical contact and electrically insulated from side surfaces of the active and n-doped layers by the lateral dielectric layer, the LED having a side-surface shape characterized by a cross-sectional area that increases monotonically from the anode contact surface of the p-doped layer to the light-exit surface of the n-doped layer, the one or more LED side surfaces having a longitudinal cross-sectional shape exhibiting (i) a first substantially constant slope at the anode contact surface and a second substantially constant slope, greater than the first, at the light-exit surface, or (ii) a slope that increases monotonically from the anode contact surface to the light-exit surface, the side-surface shape being arranged so that internal reflection within the LED or lateral dielectric layer redirects at least a portion of light emitted by the active layer and propagating within the LED outside an escape cone to propagate toward the exit surface of the n-doped layer within the escape cone.

2. The light-emitting element of claim 1, the LED having either (i) a circular, elliptical, or oval transverse cross-sectional shape, or (ii) a square, rectangular, or polygonal transverse cross-sectional shape.

3. The light-emitting element of claim 1, light emitted from the active layer exhibiting an angular distribution that includes a central lobe at least partly within an escape cone and a peripheral lobe outside the escape cone, the one or more LED side surfaces being arranged so that emitted light propagating within the peripheral lobe is internally reflected at the one or more LED side surfaces to propagate toward the exit surface of the n-doped layer within the escape cone.

4. The light emitting element of claim 3, the one or more LED side surfaces having a longitudinal cross-sectional shape being arranged so that, in a region thereof where emitted light propagating in the peripheral lobe is incident on the one or more side surfaces, that side surface region makes an acute angle $\theta_W$, relative to a surface normal of the light-exit surface, that is (i) between about $(\theta_{PL}-\theta_C)/2$ and about $(\theta_{PL}+\theta_C)/2$, $\theta_{PL}$ being the acute angle of light propagation at the maximum of the peripheral lobe relative to the surface normal, $\theta_C$ being a cone angle of the escape cone, (ii) about equal to $\theta_{PL}/2$, or (iii) between 35 degrees and 40. degrees.

5. The light-emitting element of claim 1, the lateral dielectric layer either (i) comprising only a single layer of a single dielectric material, or (ii) including a reflective coating between the one or more LED side surfaces and the bonding layer.

6. The light-emitting element of claim 1, further comprising an anti-reflection coating on the exit surface of the n-doped layer, arranged so as to reduce reflection of emitted light at the nominal emission vacuum wavelength $\lambda_0$ incident on that surface, relative to reflection at a similar surface lacking the anti-reflection coating.

7. The light-emitting element of claim 1, (i) total nonzero thickness of the layers of the LED being less than 10. μm, or nonzero thickness of the p-doped layer being less than 2.0 μm.

8. A method for making the light-emitting element of claim 1, the method comprising:
(A) forming the first and second semiconductor layers with the junction or active layer between them;
(B) forming the one or more side surfaces;
(C) forming the anode electrical contact electrically coupled to the p-doped layer; and
(D) forming the cathode electrical contact electrically coupled to the n-doped layer.

9. A light-emitting array comprising multiple light-emitting elements of claim 1 arranged with corresponding light-exit surfaces thereof in a substantially coplanar arrangement.

10. The light-emitting array of claim 9, the multiple light-emitting elements comprising discrete, structurally distinct elements assembled together to form the array.

11. The light-emitting array of claim 9, the multiple light-emitting elements of the array being integrally formed together on a common substrate.

12. The light-emitting array of claim 11, the corresponding n-doped layers of the LEDs forming a single, continuous n-doped layer spanning the array.

13. The light-emitting array of claim 9, nonzero spacing of the light-emitting elements of the array being less than 0.10 mm, and nonzero separation between adjacent light-emitting elements of the array being less than 20. μm.

14. The light-emitting array of claim 9, the light-emitting elements of the array exhibiting a contrast ratio for emitted light exiting from adjacent light-emitting elements that is greater than 5:1.

15. The light-emitting array of claim 9, further comprising a set of multiple independent electrically conductive traces or interconnects connected to the corresponding anode electrical contacts, each anode electrical contact being connected to a single corresponding one of the traces or interconnects that is different from a corresponding trace or interconnect connected to at least one other anode electrical contact.

16. The light-emitting array of claim 15, each anode electrical contact being connected to a single corresponding one of the traces or interconnects that is different from corresponding traces or interconnects connected to all other anode electrical contacts.

17. The light-emitting array of claim 15, further comprising a drive circuit (i) connected to each of the cathode electrical contacts, and (ii) connected to each of the anode electrical contacts by the electrical traces or interconnects, the drive circuit being structured and connected so as to provide electrical drive current that flows through the array and causes the array to emit light, and that is further structured and connected so that (i) corresponding portions of the electrical drive current flow through one or more corresponding LEDs as corresponding pixel currents, and (ii) each pixel current magnitude differs from the corresponding pixel current magnitude of at least one other of the LEDs of the array.

18. A method for using the light-emitting array of claim 17, the method comprising:
(A) selecting a first specified spatial distribution of pixel current magnitudes;
(B) operating the drive circuit to provide the first specified spatial distribution of pixel current magnitudes to the LEDs of the array, causing the array to emit light according to a corresponding first spatial distribution of light emission intensity across the array;
(C) selecting a second specified spatial distribution of pixel current magnitudes that differs from the first specified spatial distribution of pixel current magnitudes; and
(D) operating the drive circuit to provide the second specified spatial distribution of pixel current magnitudes to the LEDs of the array, causing the array to emit light according to a corresponding second spatial distribution of light emission intensity across the array that differs from the first spatial distribution of light emission intensity.

19. A method for making the light-emitting array of claim 17, the method comprising:
- (A) forming or assembling the multiple light-emitting elements to form the array;
- (B) forming one or more electrical traces or interconnects connected to the corresponding anode electrical contacts; and
- (C) connecting the drive circuit (i) to the corresponding anode electrical contacts using the electrical traces or interconnects, and (ii) to the corresponding cathode electrical contacts.

* * * * *